United States Patent
Edel

(10) Patent No.: US 9,188,610 B1
(45) Date of Patent: Nov. 17, 2015

(54) APPARATUS FOR MEASURING MULTIPLE ELECTRIC CURRENTS UTILIZING MULTIPLE CURRENT TRANSFORMERS

(71) Applicant: Thomas G. Edel, Portland, OR (US)

(72) Inventor: Thomas G. Edel, Portland, OR (US)

( * ) Notice: Subject to any disclaimer, the term of this patent is extended or adjusted under 35 U.S.C. 154(b) by 445 days.

(21) Appl. No.: 13/740,958

(22) Filed: Jan. 14, 2013

Related U.S. Application Data

(60) Provisional application No. 61/632,117, filed on Jan. 18, 2012.

(51) Int. Cl.
*G01R 15/20* (2006.01)
*G01R 19/20* (2006.01)
*G01R 19/00* (2006.01)
*G01R 15/18* (2006.01)

(52) U.S. Cl.
CPC .......... *G01R 19/0092* (2013.01); *G01R 15/185* (2013.01); *G01R 15/205* (2013.01); *G01R 19/20* (2013.01)

(58) Field of Classification Search
CPC .......... G01R 19/0092; G01R 19/2513; G01R 19/00; G01R 15/183; G01R 15/186; H01F 38/32; H02J 7/025
USPC ............... 324/117 R, 126, 127, 522; 361/143
See application file for complete search history.

(56) References Cited

U.S. PATENT DOCUMENTS

| | | | | |
|---|---|---|---|---|
| 5,181,026 A | * | 1/1993 | Granville | G01R 15/183 |
| | | | | 324/96 |
| 5,341,088 A | * | 8/1994 | Davis | G01R 15/14 |
| | | | | 324/105 |
| 5,426,360 A | * | 6/1995 | Maraio | G01R 15/142 |
| | | | | 324/126 |
| 5,654,630 A | * | 8/1997 | Shimoyama | G01R 15/202 |
| | | | | 323/353 |
| 6,018,700 A | * | 1/2000 | Edel | G01R 19/2513 |
| | | | | 361/18 |

(Continued)

FOREIGN PATENT DOCUMENTS

| | | | |
|---|---|---|---|
| EP | 2493063 A1 * | 8/2012 | |
| KY | EP 2493063 A1 * | 8/2012 | ........ H02M 3/33592 |

OTHER PUBLICATIONS

Liang et al., New Electronic Current Transformer with a Self-Contained Power Supply, Feb. 2015, IEEE transactions of power delivery, vol. 30.*

(Continued)

*Primary Examiner* — Patrick Assouad
*Assistant Examiner* — Sean Curtis

(57) ABSTRACT

Apparatus for measuring multiple primary electric currents in a non-contact manner by utilizing multiple current transformers. Each current transformer is coupled with one of the primary electric currents. Each current transformer comprises a magnetic core and a secondary winding. The apparatus comprises: A current-sensing means for sensing current transformer secondary currents and for producing an information signal; a voltage control and selection circuit for periodically connecting each current transformer secondary winding to the current-sensing means and for periodically controlling the voltage across each secondary winding; a power supply circuit for providing operating power to the voltage control and selection circuit; and a control circuit for receiving and processing the information signal and for controlling the voltage control and selection circuit. The control circuit and the voltage control and selection circuit function to select and control the multiple current transformers for periodic measurement of the multiple primary electric currents.

20 Claims, 15 Drawing Sheets

(56) References Cited

U.S. PATENT DOCUMENTS

| | | | | |
|---|---|---|---|---|
| 6,160,697 A * | 12/2000 | Edel | G01R 15/185 | 361/143 |
| 6,278,357 B1 * | 8/2001 | Croushore | H04B 3/54 | 340/354 |
| 6,470,283 B1 * | 10/2002 | Edel | G01R 19/2513 | 324/72.5 |
| 6,479,976 B1 * | 11/2002 | Edel | G01R 15/183 | 323/357 |
| 6,496,391 B1 * | 12/2002 | Ikeda | H02M 3/156 | 363/53 |
| 6,522,517 B1 * | 2/2003 | Edel | G01R 15/185 | 361/143 |
| 6,954,060 B1 * | 10/2005 | Edel | G01R 15/183 | 324/117 R |
| 6,984,979 B1 * | 1/2006 | Edel | G01R 15/185 | 324/253 |
| 7,157,899 B2 * | 1/2007 | Bruno | G01R 19/2513 | 315/292 |
| 7,242,157 B1 * | 7/2007 | Edel | G01R 15/185 | 315/362 |
| 7,508,224 B2 * | 3/2009 | Williams | G01R 27/32 | 307/102 |
| 7,511,979 B2 * | 3/2009 | Newman, Jr. | H02M 1/36 | 363/149 |
| 7,518,529 B2 * | 4/2009 | O'Sullivan | G01R 15/142 | 324/126 |
| 7,633,262 B2 * | 12/2009 | Lindsey | H02J 5/005 | 307/17 |
| 7,876,086 B2 * | 1/2011 | Jansen | G01R 15/183 | 324/117 R |
| 8,044,672 B2 * | 10/2011 | Williams | G01R 27/32 | 324/602 |
| 8,076,923 B2 * | 12/2011 | Suozzo | G01R 31/024 | 324/66 |
| 8,604,805 B2 * | 12/2013 | Satou | G01R 31/027 | 324/547 |
| 2006/0202664 A1 * | 9/2006 | Lindsey | H02J 5/005 | 302/137 |
| 2006/0284647 A1 * | 12/2006 | Gunn | G01R 1/22 | 324/126 |
| 2008/0077336 A1 * | 3/2008 | Fernandes | G01R 15/142 | 702/57 |
| 2009/0309754 A1 * | 12/2009 | Bou | G01R 15/18 | 340/870.02 |
| 2010/0084920 A1 * | 4/2010 | Banting | G01R 15/142 | 307/66 |
| 2010/0085036 A1 * | 4/2010 | Banting | G01R 15/14 | 324/127 |
| 2011/0156698 A1 * | 6/2011 | Cook | G01R 15/185 | 324/127 |
| 2012/0039062 A1 * | 2/2012 | McBee | H01F 27/06 | 361/825 |
| 2012/0081101 A1 * | 4/2012 | Suozzo | G01R 31/024 | 324/66 |
| 2012/0139554 A1 * | 6/2012 | Parsons | G01R 35/04 | 324/543 |
| 2012/0176120 A1 * | 7/2012 | Jefferies | G01R 15/183 | 324/124 |
| 2013/0162242 A1 * | 6/2013 | Goinga | G01R 15/183 | 324/127 |
| 2014/0043015 A1 * | 2/2014 | Marsden | G01R 29/00 | 324/86 |

OTHER PUBLICATIONS

Schneider, Measuring Three Phase Current with Two Current Transformers, www.schneider-electric.com, Apr. 2013.*

* cited by examiner

US 9,188,610 B1

APPARATUS FOR MEASURING MULTIPLE ELECTRIC CURRENTS UTILIZING MULTIPLE CURRENT TRANSFORMERS

CROSS-REFERENCE TO RELATED APPLICATION

This application claims the benefit of provisional patent application No. 61/632,117, filed on Jan. 18, 2012.

STATEMENT REGARDING FEDERALLY SPONSORED RESEARCH

Not Applicable

REFERENCE TO A COMPACT DISC APPENDIX

Not Applicable

BACKGROUND OF THE INVENTION

This invention relates to the art of electric current measurement, and especially to the art of utilizing ordinary current transformers to measure a-c (alternating-current) current, d-c (direct-current) current, and a-c current having a d-c current component. The invention disclosed herein utilizes a common electronic control circuit to provide magnetic control for multiple current transformers, thereby providing a way to accurately measure multiple electric currents for lower cost than competing technologies.

The present invention is a development of the inventions disclosed in U.S. Pat. No. 6,160,697 to Edel, issued Dec. 12, 2000; U.S. Pat. No. 6,522,517 to Edel, issued Feb. 18, 2003; and U.S. Pat. No. 7,242,157 to Edel, issued Jul. 10, 2007. These patents will be referenced herein as "the 697 patent", "the 517 patent", and "the 157 patent" respectively.

U.S. Pat. No. 6,522,517 to Edel, issued Feb. 18, 2003, (the 517 patent) is hereby incorporated by reference, in its entirety, into this disclosure.

The 697 patent and the 517 patent disclose how a varying voltage, produced by a "controllable voltage device," may be applied to a conductive winding that magnetically interacts with a magnetic body. The varying voltage controls the voltage induced in the winding in such a way that the integral over time of the induced voltage correlates to desired changes of the induction of the magnetic body. (As used in this disclosure, the term "induction level" is synonymous with the terms "magnetization" and "magnetic flux density"). The induction level may be controlled in several ways:
(a) The induction level of a magnetic body may be caused to transition from a known induction level to a preferred induction level. (A preferred induction level of zero may be chosen to demagnetize a magnetic body).
(b) When the induction level is not known, a preferred induction level may be established by changing the induction level of the magnetic body from an unknown induction level to a known induction level and then to the preferred induction level.
(c) A preferred induction level may be maintained by causing the induced voltage across the winding to have an average value near zero (or by causing the integral of induced voltage to not exceed a predetermined value).
(d) A preferred induction level may be more strictly maintained by causing the induced voltage across the winding to continuously be near zero volts, thereby reducing the amount that the induction level fluctuates.
(e) The induction level may be made to vary with time in a preferred manner, including matching a control signal that is proportional to a reference induction level.

The varying voltage may be generated directly by an active voltage source, or the varying voltage may be generated indirectly, such as by current transformer secondary current flowing through an adjustable impedance. The key elements are a magnetic body, a conductive winding that magnetically interacts with the magnetic body, and a means of causing the induced voltage to have the appropriate waveform and magnitude.

A conductive winding that is utilized for controlling induction level may be a permanent winding that is also used for other purposes, or it may be a dedicated winding (permanent or temporary) provided solely for the purpose of controlling induction level.

These principles are most readily applied to magnetic bodies that are configured to have a relatively uniform magnetic path, such as the magnetic cores of current transformers. Using the principles of the 517 patent, the accuracy of a current transformer may be improved in three ways:
(a) By demagnetizing a current transformer, inaccuracies associated with core magnetization are removed. A demagnetized current transformer can accurately measure d-c current and a-c current that has a d-c component.
(b) By keeping the integral over time of induced voltage near zero, a current transformer is better able to measure unsymmetrical currents without quickly transitioning to saturation.
(c) By reducing the amount that the magnetic flux in the core fluctuates, inaccuracies associated with magnetizing current may be greatly reduced and the accuracy of a current transformer may be greatly improved.

Some embodiments of the present invention utilize voltage pulses to control the magnetization of a current transformer magnetic core, rather than a continuously adjustable voltage (as discussed in the 517 patent). The 157 patent discusses this type of switched-voltage magnetic control. Since the 157 patent incorporates the 517 patent by reference, the 157 patent cannot be incorporated herein by reference (per patent office rules). So, for completeness, it is necessary to include herein some of the information contained in the 157 patent.

FIGS. 1 to 9 provide prior-art background information. FIGS. 1 and 2 illustrate ordinary current transformers applied without electronic assist. FIGS. 3 to 9 illustrate ordinary current transformers applied with electronic assist in accordance with the 517 patent and the 157 patent. FIGS. 3 to 9 are similar to FIGS. 1 to 7 of the 157 patent. FIGS. 3 and 4 are also similar to FIGS. 1 and 21 of the 517 patent.

FIG. 1 illustrates a simple prior-art current transformer circuit for measuring a-c current. A current transformer CT comprises a magnetic core 12 and a secondary winding 13.

An electric power system conductor 10 has an insulating covering 11. Power system conductor 10 functions as a primary winding of current transformer CT, with only one turn, with a primary electric current J1 flowing in it. Though shown with one end disconnected, power system conductor 10 is normally connected as part of an electric power system.

For clarity, current transformer CT comprises a magnetic core 12 and a secondary winding 13 magnetically coupled to magnetic core 12; a primary (or "first") electric current J1 flows in conductor 10 which is configured as a primary winding of current transformer CT; a secondary electric current J2 flows in secondary winding 13; secondary electric current J2 is generally proportionally smaller than primary electric current J1 by a turns ratio of current transformer CT. (Generally speaking, if a current transformer secondary current is known, then the primary current is calculable as the secondary current multiplied by the turns ratio of the current transformer).

As shown in FIG. 1, secondary winding 13 and resistor R1 are connected in series, so that secondary electric current J2 flows through each of them. A ground connection 14 provides a reference for voltage measurements.

Resistor R1 is a current-sensing resistor with low resistance, and may be thought of as one possible embodiment of a "current-sensing means." Voltage V3, across resistor R1, is proportional to secondary electric current J2, and may be considered to be an information signal that contains information about secondary electric current J2. Resistor R1 functions as a current-sensing means for sensing secondary electric current J2 and provides an information signal containing information about secondary electric current J2.

Winding 13 is shown with ten turns around magnetic core 12. The actual number of turns may vary widely depending on the application. Magnetic core 12 is shown as a solid-core toroid, though wide variation in magnetic core configurations is possible and the illustration is not intended to limit the breadth of application of the invention. Of particular note is the possible use of split-core current transformers, which can be installed around existing conductors without having to thread one end of the primary conductor through the window opening of the current transformer.

A measurement circuit 15 comprises an analog-to-digital circuit 22 and a microcontroller circuit 23. Analog-to-digital converter circuit 22 has a high-impedance voltage-sensing input (connected to conductor 4) to enable sensing of voltage V3 relative to the potential of conductor 5. Analog-to-digital converter circuit 22 receives the information signal (voltage V3) via conductors 4 and 5, and converts the signal to a digital information signal for use by microcontroller 23. Analog-to-digital converter circuit 22 and microcontroller 23 communicate via an interface shown as four conductors, and this interface may vary considerably depending on the particular design.

Microcontroller 23 processes the digital signal, and typically communicates information about the measured current to other equipment or a visual display via multiple conductors 16. Microcontroller 23 may be part of a larger electric power monitor which also measures voltage, in which case microcontroller 23 may utilize the information about the electric current to calculate electric power or electric energy parameters.

FIG. 2 illustrates prior art non-contact a-c current measurement of multiple a-c currents with no electronic assist. FIG. 2 is similar to FIG. 1, except that FIG. 2 shows multiple current transformers (each labeled CT) for measuring multiple primary electric currents (each labeled J1) flowing in multiple power system conductors (each labeled 10). Many components are the same as previously shown, and these components function in the manner previously described. Multiple current-sensing resistors (each labeled R1) are now shown, one for each current transformer. Analog-to-digital converter circuit 22 now has multiple input channels, one for each current-sensing resistor. Analog-to-digital converter circuit 22 may be configured to sample each input channel continuously, or it may be configured to sample only one input channel at once. The number of current transformers and current-sensing resistors connected to a single measurement circuit 15 may vary widely, depending on the application.

FIG. 3 illustrates the general configuration of prior art current measurement utilizing electronic assist, as described in the 517 patent. A controllable voltage device 6 provides an output voltage V1 for magnetic control of current transformer CT. This configuration makes it possible to utilize ordinary current transformers to measure d-c currents and a-c currents having a d-c current component (d-c currents having one or more a-c current components are considered to be the same as a-c currents having a d-c component). Improved accuracy in the measurement of a-c currents is also possible.

Controllable voltage device 6 is connected in series with secondary winding 13 and current-sensing resistor R1, so that secondary electric current J2 flows through each of them. A control circuit 3 now is responsible for both receiving and processing the information signal (voltage V3) and controlling controllable voltage device 6. The dashed lines 60 between control circuit 3 and controllable voltage device 6 indicate control mechanisms by which control circuit 3 controls the connected device (this is the typical meaning of dashed lines connecting from a control circuit throughout this disclosure). The actual control mechanism may vary widely, depending on the particular embodiment.

Control circuit 3 has a high-impedance voltage-sensing input (connected to conductor 4) to enable sensing of voltage V3 relative to the potential of conductor 5. As before, voltage V3 across resistor R1 is proportional to secondary electric current J2. Voltage V2 is the voltage across secondary winding 13, which is the induced voltage generated by changing flux in magnetic body 12 plus any voltage drop associated with current J2 flowing through stray winding impedances. Often, the voltage drop associated with secondary current J2 flowing through stray winding impedances is small compared to the induced voltage and may be ignored in some applications. Voltage V1 is the adjustable output voltage of controllable voltage device 6. Please refer to the 517 patent for additional information.

FIG. 4 illustrates a preferred embodiment of the controllable voltage device of FIG. 3, in accordance with the 517 patent. This configuration provides a continuously adjustable bipolar voltage output (output voltage V1) for magnetic control. Many components are the same as previously shown, and these components function in the manner previously described.

Control circuit 3A has an analog-to-digital converter circuit 22 to sense secondary current J2 (as voltage V3 across current-sensing resistor R1), a microcontroller 23 for data processing and control functions, and a digital-to-analog converter circuit 24. Digital-to-analog converter circuit 24 provides an analog voltage signal on conductor 25 that controls the voltage output of controllable voltage device 6A. Analog-to-digital converter circuit 22 and microcontroller 23 communicate via an interface shown as four conductors, and this interface may vary considerably depending on the particular design. Likewise microcontroller 23 communicates with digital-to-analog converter circuit 24 via an interface shown as four conductors, and this interface may vary considerably depending on the particular design. Alternately, the analog-to-digital converter and digital-to-analog converter may be an integral part of the microcontroller.

Controllable voltage device 6A has a voltage control circuit 1A, and a power supply circuit 2A. Voltage control circuit 1A has an operational amplifier 21, with resistors R7 and R8 configured to set the gain of operational amplifier 21. Power supply circuit 2A provides operating power to operational amplifier 21. A positive d-c voltage is provided at terminal VP, a negative d-c voltage is provided at terminal VN, both relative to a common voltage terminal VG.

Control circuit 3A also requires a power supply circuit, which is not shown. These power supply circuits are well-established in the prior art.

Ground connection 14 provides a common reference potential for the various circuits and power supply. If a particular application requires that winding 13 be directly grounded on one side, then resistor R1 may be relocated and connected in series with the opposite side of winding 13. This complicates the measurement of voltage V3 across resistor R1 somewhat, but prior-art differential voltage measurement methods are adequate and may be used.

Operational amplifier 21 must be able to produce voltage in a circuit with relatively large current driven by a current source (a current transformer acts like a current source). A "power operational amplifier" will usually be required, as discussed in the 517 patent.

The type of control configuration shown in FIG. 4 (utilizing an analog-to-digital converter circuit to sense an input signal, a microcontroller to implement a control function based on the input signal, a digital-to-analog converter to produce an analog control signal, and an operational amplifier to produce a voltage proportional to the analog control signal) is well established in the prior art, so additional configuration details will not be described herein. Microcontroller 23 is configured/programmed to implement the control sequences illustrated and discussed in the 517 patent.

FIG. 5 illustrates the use of a power supply circuit 2B and voltage control circuit 1B as a controllable voltage device 6B, providing a switched-voltage output in accordance with the 157 patent. Many components are the same as previously shown, and these components function in the manner previously described. Power supply circuit 2B provides a single d-c (direct-current) voltage output V4 across two terminals: terminal VP, which has a positive polarity relative to second terminal VN. In the configuration shown, the output of power supply circuit 2B does not have any common connection with the rest of the circuit, so that output voltage V4 can be applied so as to result in a positive or negative polarity at the output of voltage control circuit 1B. That is to say, that aside from connections made by electronic switches 26 and 27, the power supply circuit is isolated from the rest of the circuit.

Voltage control circuit 1B functionally comprises two single-pole triple-throw electronic switches which operate in tandem as controlled by control circuit 3. Electronic switches 26 and 27 operate simultaneously to cause voltage V1 to have one of three values: voltage V1 having positive polarity equal in magnitude to power supply voltage V4, voltage V1 having negative polarity and equal in magnitude to power supply voltage V4, and voltage V1 having a magnitude of approximately zero volts (power supply circuit 2B not connected, and electronic switches 26 and 27 providing a low-impedance path for secondary current J2).

Stated another way, voltage control circuit 1B periodically connects power supply output voltage V4 in series with secondary electric current J2. Voltage control circuit 1B also provides a low-impedance path for secondary current J2 during time periods that power supply circuit 2B is not connected in series with secondary current J2. Voltage control circuit 1B and power supply 2B are configured to provide both positive voltage and negative voltage connected in series with secondary electric current J2, the positive voltage and negative voltage being connected one at a time.

Power supply circuit 2B and voltage control circuit 1B operate together to provide an adjustable output voltage (V1) that is effectively a bipolar pulsed voltage.

Speaking of magnetic control in general, the rate of change of magnetic flux in magnetic core 12 is proportional to the voltage induced in secondary winding 13. Generally speaking, in FIG. 5 control circuit 3 controls the voltage pulses at voltage V1 so that the average value over time of the sum of voltage V1 pulses and of voltage drops associated with secondary electric current J2 flowing through loop impedances is approximately equal to the preferred induced voltage in secondary winding 13, thereby causing the rate of change of magnetic flux to be the preferred value.

When using the term "average value over time," the time period over which the averaging occurs is significant. In the context of induced voltage calculations within this disclosure, this period of time is preferably equal to the length of time of an integral number of complete voltage pulse cycles (including any off time that is part of a full cycle). A time period spanning only one voltage pulse cycle will generally provide the most accurate control.

For optimal control, control circuit 3 utilizes characteristics of loop impedances through which secondary electric current J2 flows to optimize the control of voltage control circuit 1B for improved control of the magnetic flux of magnetic core 12. Control circuit 3 uses information signal V3 along with known characteristics of loop impedances to calculate the induced voltage generated in winding 13 by flux changes in magnetic core 12. The voltage pulses at voltage V1 are controlled so that the average value of the voltage induced in the winding is the preferred value. For accurate control, the magnitude of voltage V1 should be part of the calculation implemented by control circuit 3, either as a known voltage based on fixed power supply voltage V4 and the states of electronic switches 26 and 27, or voltage V1 may be directly measured by control circuit 3 (measurement of voltage V1 by control circuit 3 would require an additional connection not shown).

Loop impedances include stray impedances associated with winding 13, stray impedances in various connecting wires and electronic switches, and the impedance of current-sensing resistor R1.

For many applications it is desirable to minimize flux variations, in which case control circuit 3 is configured to cause the average value over time of voltage V1 pulses to be approximately equal to, and have opposite polarity as, the sum of voltage drops associated with current J2 flowing through loop impedances, thereby causing the average value of induced voltage to be near zero, thereby minimizing flux changes. This type of control is illustrated by FIGS. 9A to 9E (discussed below).

Stated another way, control circuit 3 receives voltage V3 (which is an information signal containing information about secondary electric current J2) and uses this information for controlling voltage control circuit 1B in such a way as to control changes of magnetic flux in magnetic core 12, thereby reducing the secondary current error, whereby secondary electric current J2 is caused to be more accurately proportional to primary electric current J1. Control circuit 3 operates while current transformer CT is in service.

FIG. 6 illustrates a development of FIG. 5 in which power supply circuit 2A has two voltage outputs relative to a common terminal VG (similar to FIG. 4). Many components are the same as previously shown, and these components function in the manner previously described. A positive d-c voltage is available at terminal VP, and a negative d-c voltage is available at terminal VN. Voltage control circuit 1C is now somewhat simplified (compared to FIG. 5), utilizing three single-pole single-throw electronic switches 28, 29, and 30. The configuration of FIG. 6 is functionally similar to the configuration of FIG. 5, but is easier to realize in practice, since the electronic switches are considerably simpler and the power supply no longer requires an isolated output. Voltage control circuit 1C and power supply circuit 2A together form controllable voltage device 6C.

In the configuration of FIG. 6 voltage control circuit 1C still provides just three values for output voltage V1. With just electronic switch 28 closed, voltage V1 has positive polarity equal to the voltage provided by power supply terminal VP. With just electronic switch 29 closed, voltage V1 has negative polarity equal to the voltage provided by power supply terminal VN. With just electronic switch 30 closed, a low-impedance path is provided for current J2, and voltage V1 is approximately zero volts. Only one switch is normally closed at a time. For most applications, the voltage magnitude of the power supply positive and negative d-c voltage outputs will be fixed (not adjustable) and will be approximately equal. An optional ground connection 14 provides a reference voltage level for the circuit.

FIGS. 7A to 7E illustrate the magnetic operation of an ordinary prior-art current transformer without electronic assist, similar to FIG. 1 and FIG. 2. The waveforms are based on the current transformer operating a-c primary current in sinusoidal steady-state conditions at time T1. Time T2 is a reference mark for waveform comparison. Time T3 marks a change to d-c primary current. Time T4 marks the time that the current transformer magnetic core saturates due to the d-c primary current.

FIG. 7A illustrates one possible primary current waveform for primary current J1. This is the same reference waveform as shown in FIGS. 8A and 9A. The waveform is simply a sinusoidal a-c current for two cycles, then changes to a positive d-c current at time T3.

FIG. 7B simply illustrates that voltage V1 is continuously zero for an ordinary current transformer without electronic assist.

FIG. 7C illustrates the magnetic flux density waveform Y (of magnetic core 12), with the vertical axis scaled linearly from −100% (negative saturation) to +100% (positive saturation). The current transformer burden is assumed to be resistive, so flux waveform Y is 90 degrees out-of-phase with primary current J1 (FIG. 7A) while primary current J1 is sinusoidal. The magnetic core is seen to quickly saturate when primary current J1 changes to a d-c current.

FIG. 7D illustrates the waveform of secondary electric current error J2E. The secondary electric current error is related to a build-up of a magnetic flux in magnetic core 12. For purposes of this disclosure, "secondary electric current error" is the instantaneous difference between the actual secondary electric current (J2) and an ideal secondary electric current calculated as the instantaneous primary electric current (J1) divided by the turns ratio of the current transformer (CT). FIG. 7D shows that secondary current error J2E is relatively large (when compared to FIGS. 8D and 9D with electronic assist). The error becomes 100% (when expressed as a percentage of ideal secondary current) at time T4 when the current transformer magnetic core saturates and secondary current J2 goes to zero magnitude.

FIG. 7E illustrates the waveform of secondary electric current J2. The effects of secondary current error J2E are fairly clear: the sinusoidal waveform is time shifted relative to primary current J1, and the current transformer is unable to maintain a d-c current output. A less-apparent magnitude error is also present during a-c current operation (prior to time T3).

FIGS. 8A to 8E illustrate the magnetic operation of a prior-art current transformer with electronic assist using a continuously adjustable output voltage (this is functionally similar to the configuration of FIG. 4 if control circuit 3A operates to compensate for secondary burden).

FIG. 8A illustrates one possible primary current waveform for primary current J1. This is the same reference waveform as shown in FIGS. 7A and 9A.

FIG. 8B simply illustrates that voltage V1 is continuously controlled to compensate for secondary burden. Since the burden (the sum of all loop impedances) is assumed to be resistive, voltage V1 has a waveform that is virtually the same as secondary current J2 (FIG. 8E), which, due to the high accuracy of the assisted current transformer, is virtually the same waveform as primary current J1 (FIG. 8A).

FIG. 8C illustrates the magnetic flux density waveform Y (of magnetic core 12), with the vertical axis scaled linearly from −100% (negative saturation) to +100% (positive saturation). Ideal burden compensation is assumed, so the flux density remains very close to zero.

FIG. 8D illustrates the waveform of the secondary electric current error J2E. Since secondary current error J2E is closely related to the magnetic flux density Y of the magnetic core, and the flux density remains near zero as shown in FIG. 8C, current error J2E is near zero.

FIG. 8E illustrates the waveform of secondary electric current J2. Since secondary current error J2E is near zero, the waveform of secondary current J2 is almost identical to primary current J1 (though secondary current J2 is smaller than primary current J1 by the turns ratio of current transformer CT).

FIGS. 9A to 9E illustrate the magnetic operation of a prior-art current transformer with electronic assist using a switched-voltage output (this is functionally similar to the configuration of FIGS. 5 and 6 if control circuit 3 operates to compensate for secondary burden).

FIG. 9A illustrates one possible primary current waveform for primary current J1. This is the same reference waveform as shown in FIGS. 7A and 8A.

FIG. 9B illustrates that voltage V1 is now controlled with a pulse-width-modulated type of control to compensate for secondary burden. Control circuit 3 controls voltage V1 so that its average value over a brief period of time is approximately equal to the continuous voltage shown in FIG. 8B. The pulse frequency shown was chosen for illustrative purposes; it is normally advantageous to have a pulse frequency that is fast relative to the highest frequency that is to be measured. The relatively slow pulse frequency shown exemplifies a small time lag that is inherent in a PWM control response; this is most visible immediately after time T3.

FIG. 9C illustrates the magnetic flux density waveform Y (of magnetic core 12), with the vertical axis scaled linearly from −100% (negative saturation) to +100% (positive saturation). The pulse-width-modulated voltage output provides burden compensation that is somewhat less than ideal, which results in a somewhat jagged flux waveform. However, flux still remains relatively close to zero, and flux control is still good.

FIG. 9D illustrates the waveform of the secondary electric current error J2E. Since secondary current error J2E is closely related to the magnetic flux density Y of the magnetic core (and the magnetic core does not saturate), current error J2E has a waveform that is similar to the waveform of magnetic flux Y. The current error waveform J2E is seen to be very small relative to the waveform of FIG. 7D (the case of the uncompensated current transformer).

FIG. 9E illustrates the waveform of secondary electric current J2. Since secondary current error J2E is very small, the waveform of secondary current J2 is almost identical to primary current J1.

FIGS. 9A to 9E illustrate how switched-voltage pulses may be used to approximate the burden-reducing compensation described in the 517 patent. Using similar principles, switched voltages can be utilized to approximate other operating modes described in the 517 patent:

(a) The induction level of a magnetic body may be caused to transition from a known induction level to a preferred induction level. (A preferred induction level of zero may be chosen to demagnetize a magnetic body).

(b) When the induction level is not known, a preferred induction level may be established by changing the induction level of the magnetic body from an unknown induction level to a known induction level (such as saturation) and then to the preferred induction level.

(c) A preferred induction level may be maintained by causing the induced voltage across the winding to have an average value near zero (or by causing the integral of induced voltage to not exceed a predetermined value).

(d) The induction level may be made to vary with time in a preferred manner, including matching a control signal that is proportional to a reference induction level.

Refer to the 157 patent for additional information about utilizing switched voltages for magnetic control of current transformers.

BRIEF SUMMARY OF THE INVENTION

Apparatus for measuring multiple primary electric currents in a non-contact manner by utilizing multiple current transformers.

Each current transformer has a magnetic core and a secondary winding. Each current transformer has a primary electric current flowing in a primary conductor. Each primary conductor is configured as a primary winding of the respective current transformer. A secondary electric current flows in each secondary winding.

The apparatus comprises:

(a) A current-sensing means for periodically receiving each secondary electric current and for providing an information signal containing information about each secondary electric current.

(b) A voltage control and selection circuit for periodically connecting each secondary winding to the current-sensing means and for periodically controlling the voltage across each secondary winding. When installed, the voltage control and selection circuit is connected to each secondary winding and is connected to the current sensing means.

(c) A power supply circuit for providing operating power to the voltage control and selection circuit. The power supply circuit is connected to the voltage control and selection circuit.

(d) A control circuit for receiving the information signal and for controlling the voltage control and selection circuit. The control circuit is connected to the current-sensing means and the voltage control and selection circuit;

The control circuit and the voltage control and selection circuit function to select and control the multiple current transformers for periodic measurement of the multiple primary electric currents.

The control circuit and the voltage control and selection circuit further function to periodically route each of the secondary electric currents through the current-sensing means, thereby providing for periodic measurement of each of the primary electric currents.

The current transformers may be an integral part of the apparatus, or may be separate from the apparatus, depending on the application. The primary currents to be measured may be a-c currents, d-c currents, and/or a-c currents having a d-c component.

The apparatus may be an integral part of a larger measurement system, such as an electric energy meter, an electric power meter, or a data acquisition system.

DETAILED DESCRIPTION OF THE INVENTION

FIGS. 1 to 9 have already been discussed above, under "Background of the Invention."

Figure 1:
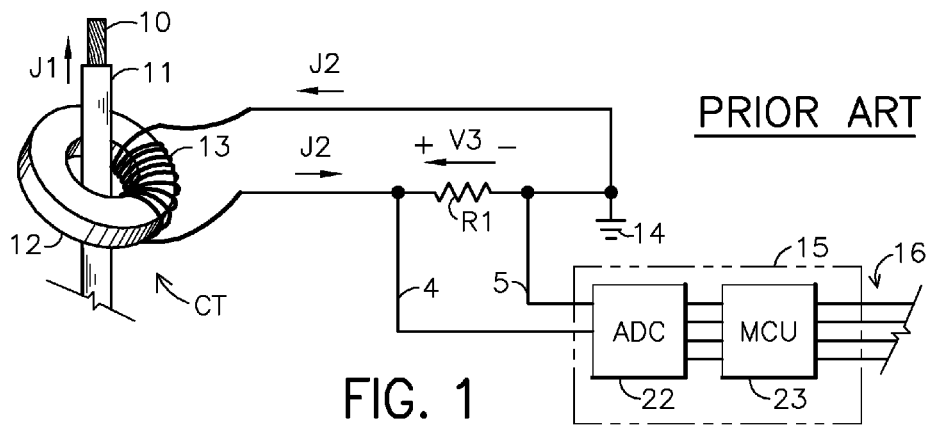
FIG. 1 illustrates prior art non-contact a-c current measurement with no electronic assist. An ordinary current transformer CT is connected to a current-sensing resistor R1. Voltage V3 across resistor R1 is proportional to secondary current J2, and is measured by an analog-to-digital converter circuit 22.
Figure 2:
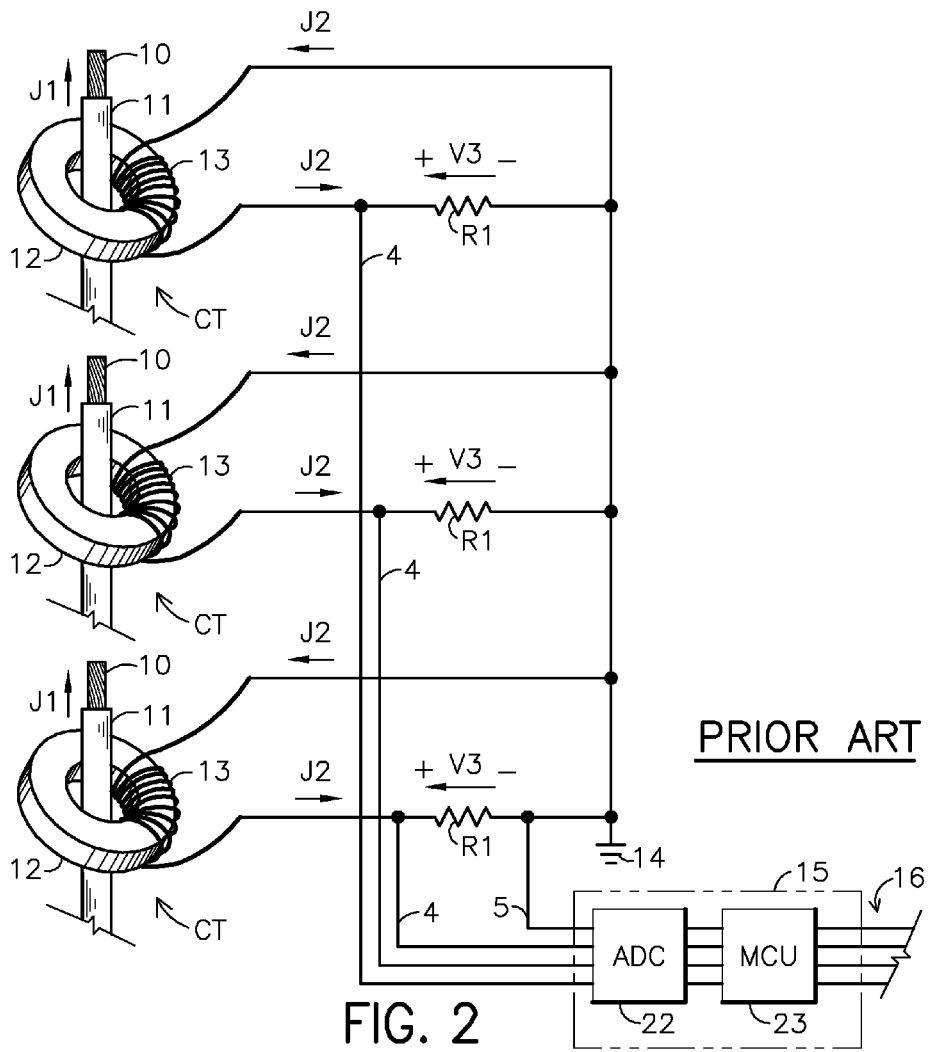
FIG. 2 illustrates prior art non-contact measurement of multiple a-c currents with no electronic assist. Operation is similar to FIG. 1, except that multiple current transformers and multiple current-sensing resistors are now used.
Figure 3:
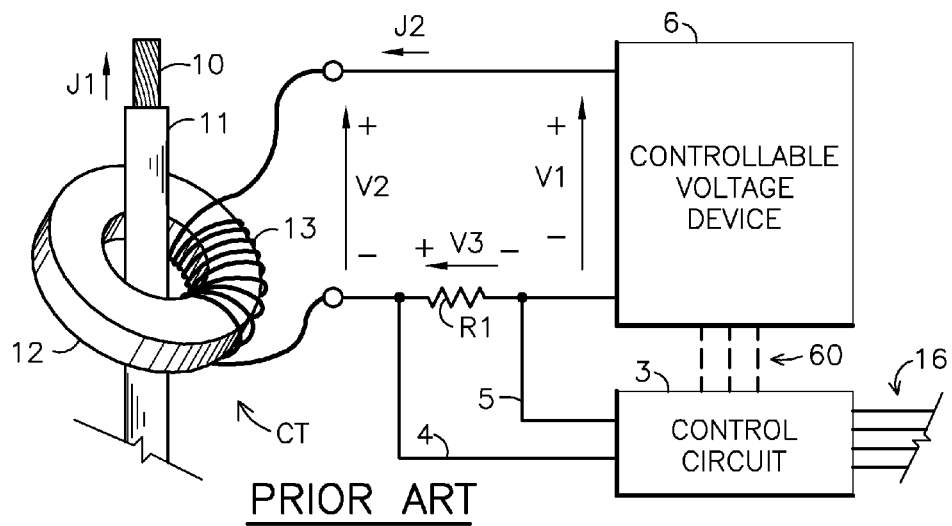
FIG. 3 illustrates the general configuration of prior art current measurement utilizing electronic assist, as described in the 517 patent. A controllable voltage device 6 provides an output voltage V1 for magnetic control of current transformer CT.
Figure 4:
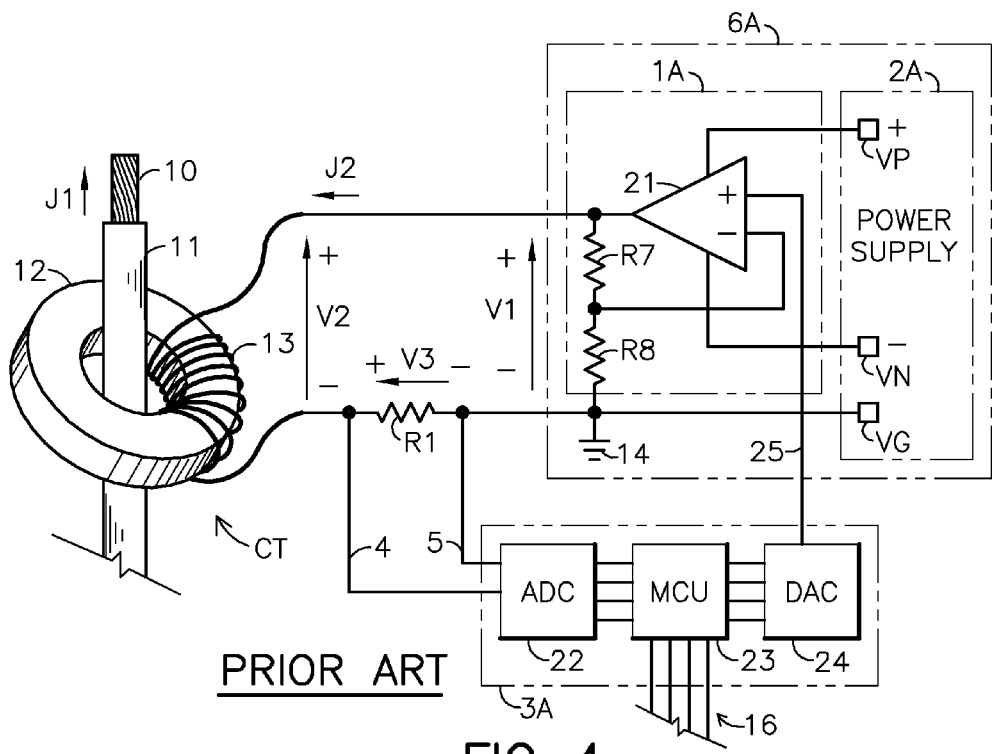
FIG. 4 illustrates a preferred embodiment of the controllable voltage device of the prior art, per the 517 patent. This configuration provides a continuously adjustable bipolar voltage output (output voltage V1) for magnetic control.
Figure 5:
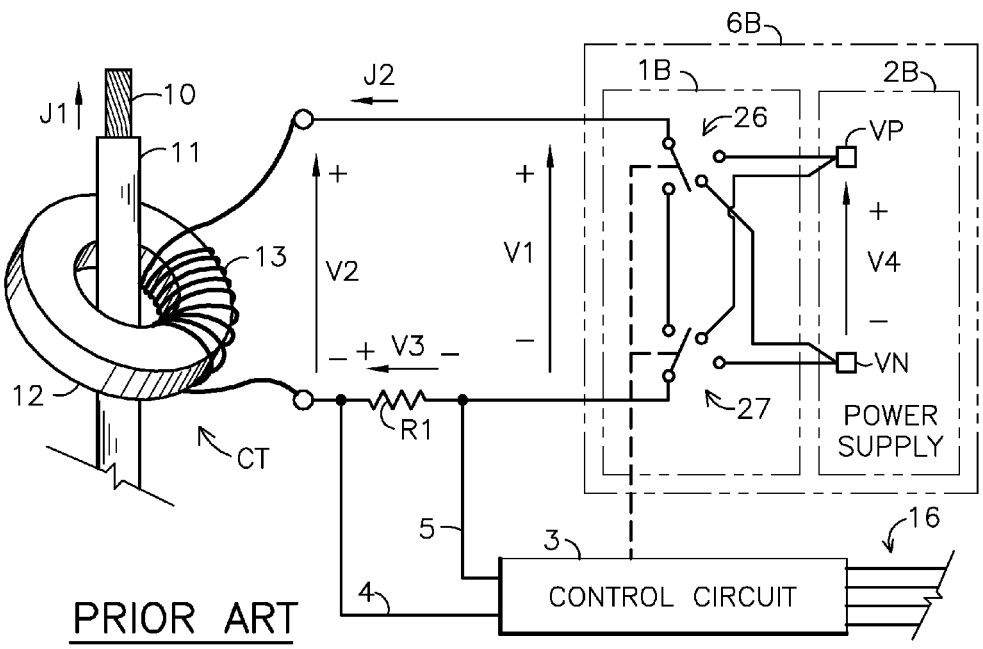
FIG. 5 illustrates the general configuration of the prior art described in the 157 patent. A controllable voltage device 6B comprises a power supply circuit 2B and a voltage control circuit 1B for providing a bipolar switched-voltage output for magnetic control.
Figure 6:
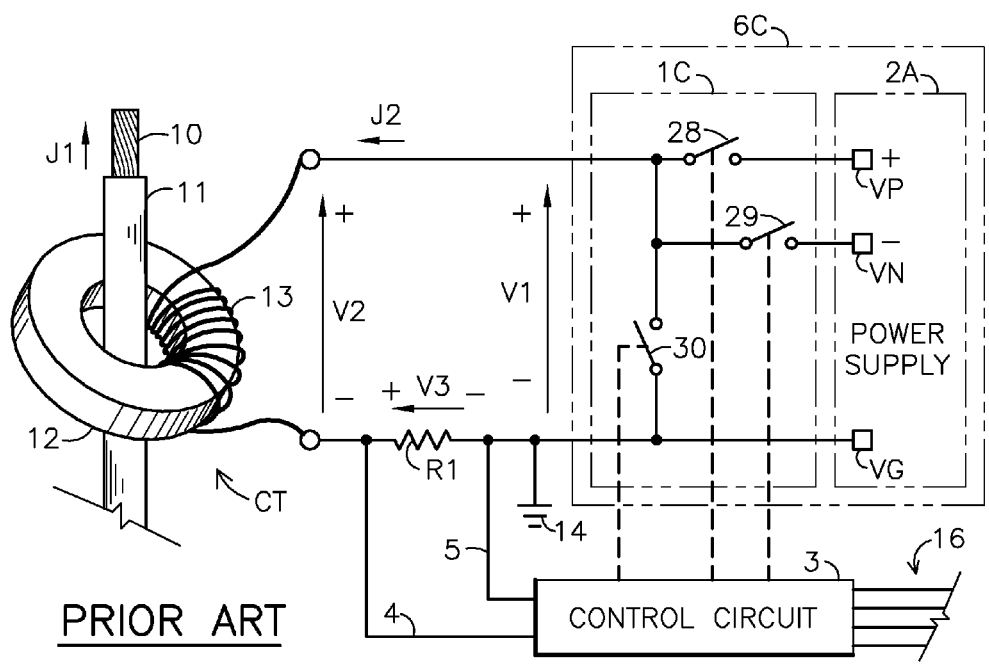
FIG. 6 illustrates a configuration similar to FIG. 5, but now with a power supply 2A and a voltage control circuit 1C that are easier to realize than the configuration shown in FIG. 5.
Figure 7A:
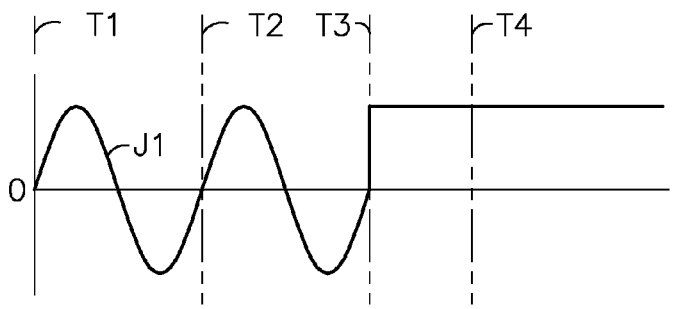
FIGS. 7A to 7E illustrate waveforms associated with prior-art current transformer operation, with no electronic assist. These waveforms are applicable to the type of prior-art shown in FIGS. 1 and 2.
Figure 7B:
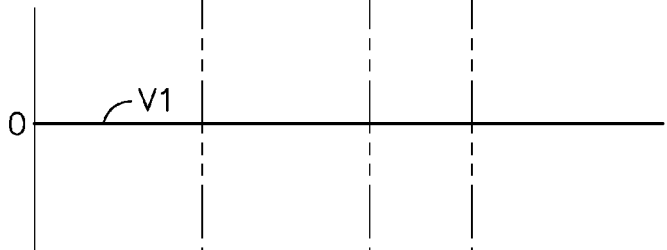
Figure 7C:
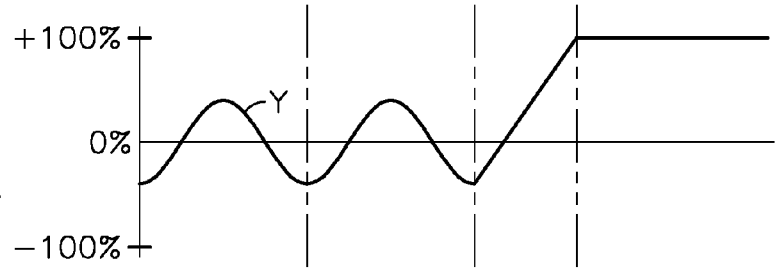
Figure 7D:
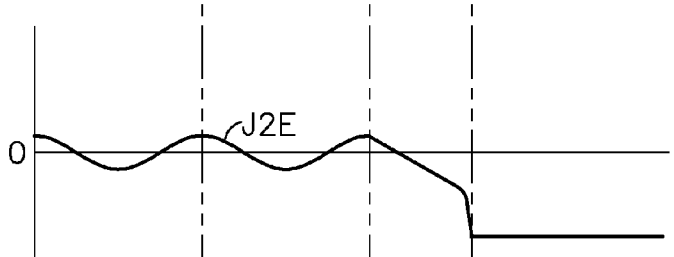
Figure 7E:
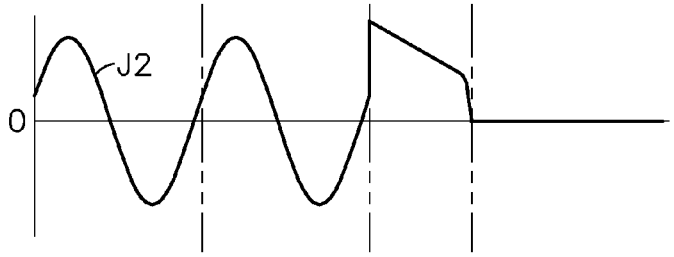
Figure 8A:
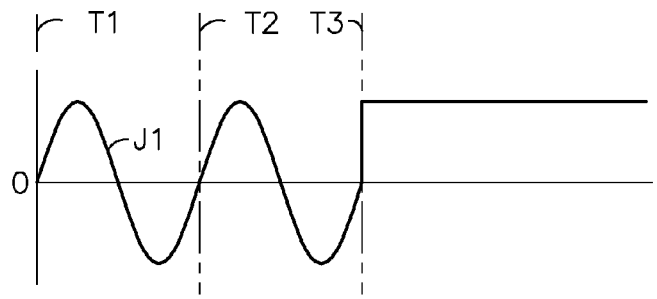
FIGS. 8A to 8E illustrate waveforms associated with prior-art current transformer operation with electronic assist, using a continuously adjustable voltage. These waveforms are applicable to the type of prior-art electronic assist shown in FIG. 4.
Figure 8B:
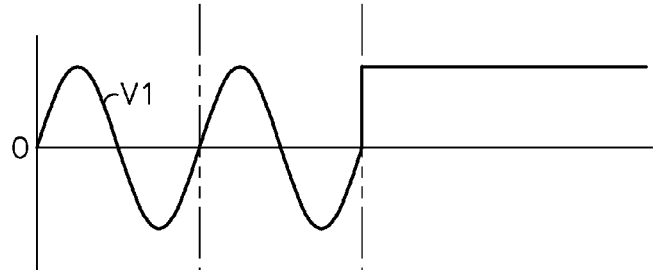
Figure 8C:
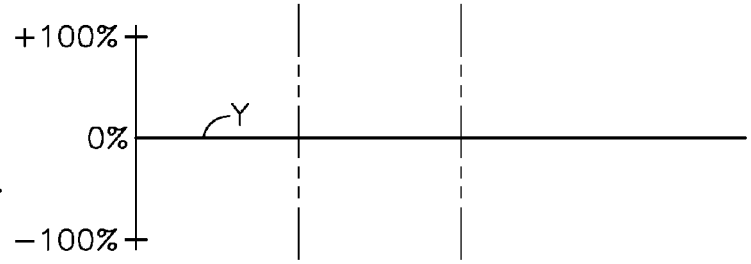
Figure 8D:
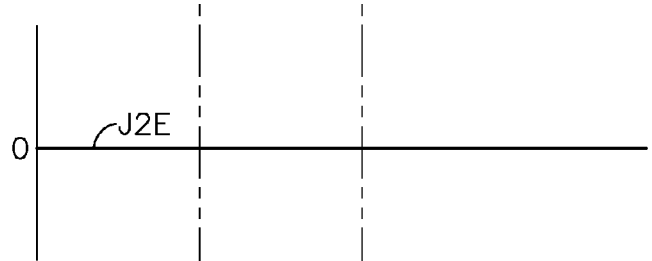
Figure 8E:
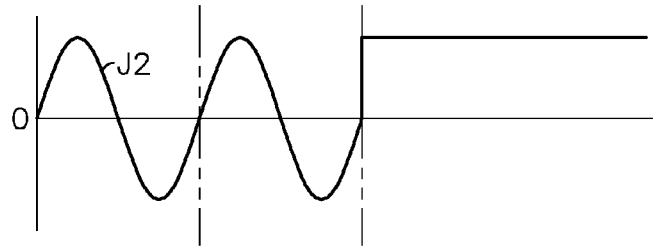
Figure 9A:
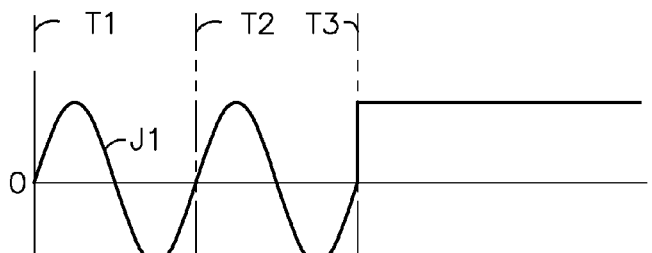
FIGS. 9A to 9E illustrate waveforms associated with prior-art current transformer operation with electronic assist, using bipolar switched voltages. These waveforms are applicable to the type of prior-art electronic assist shown in FIGS. 5 and 6.
Figure 9B:
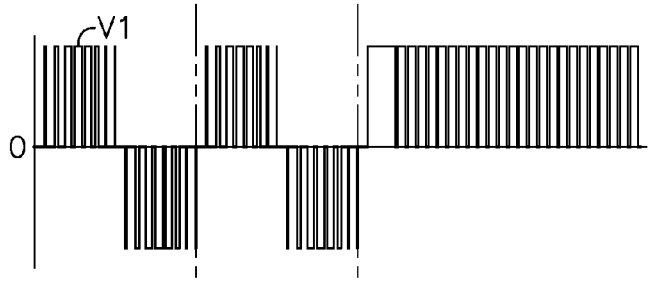
Figure 9C:
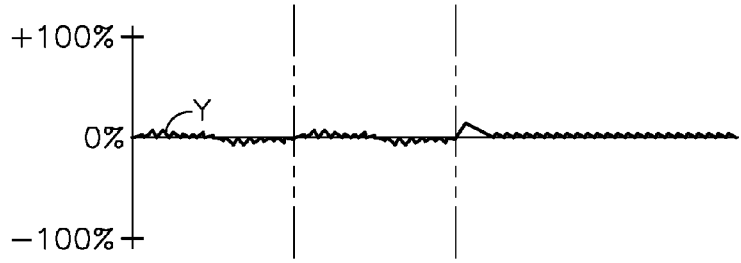
Figure 9D:
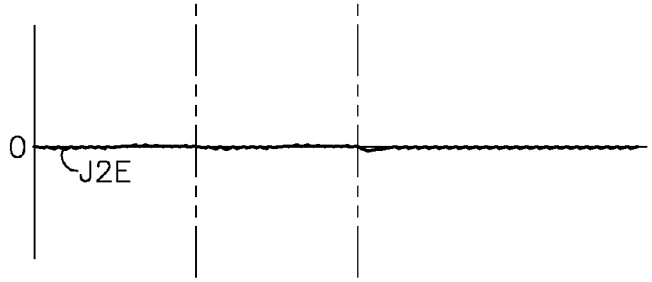
Figure 9E:
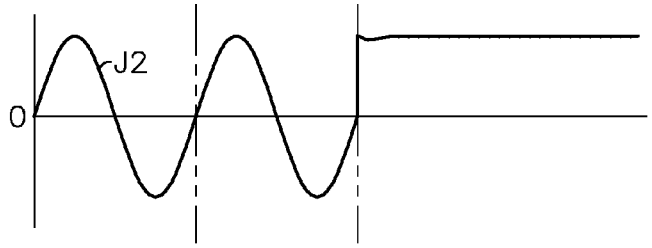
Figure 10:
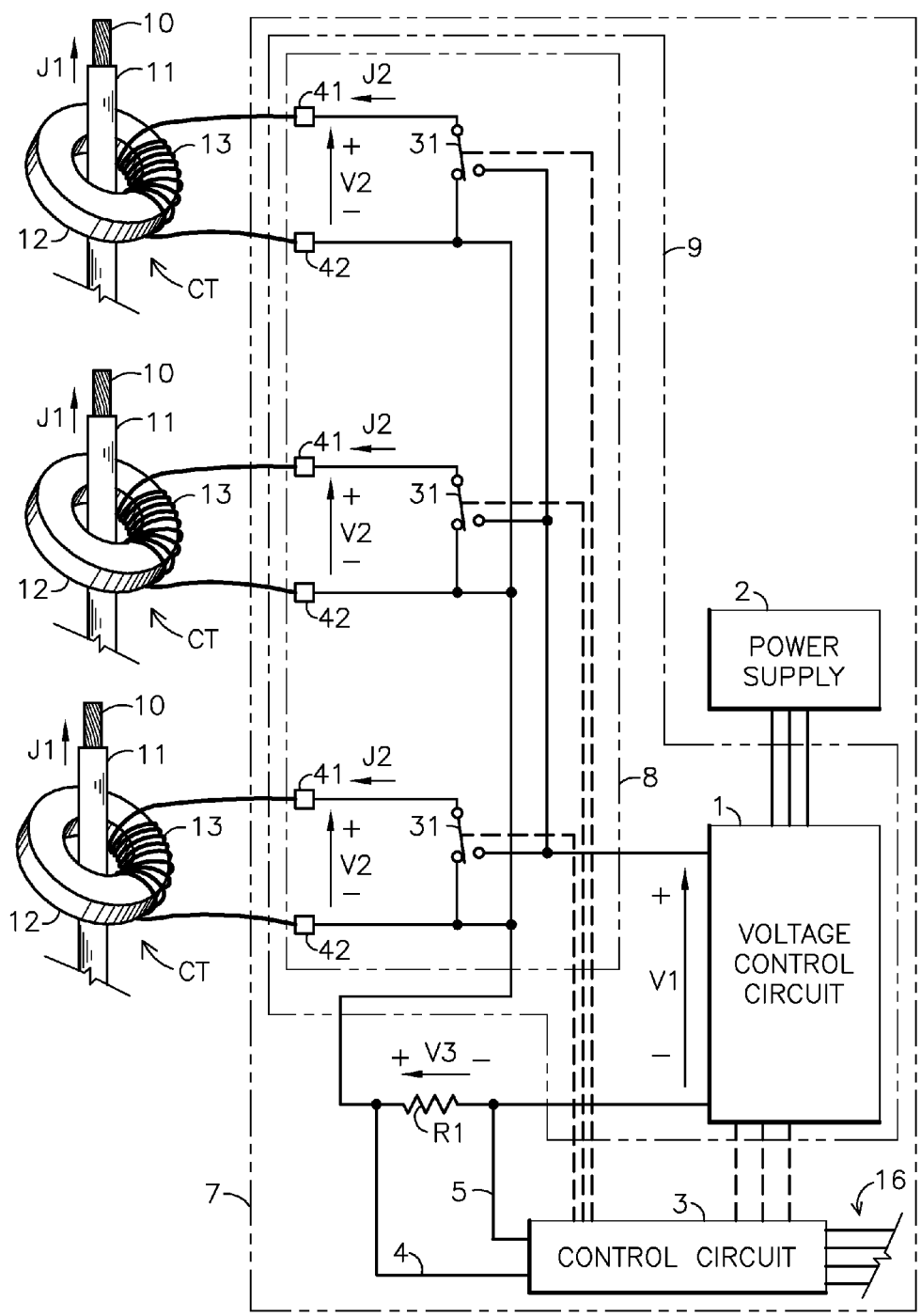
FIG. 10 illustrates a functional embodiment of the present invention. Apparatus 7 comprises a current-sensing resistor R1, a voltage control and selection circuit 9, a power supply circuit 2, and a control circuit 3. Control circuit 3 and voltage control and selection circuit 9 function to select and control multiple current transformers for periodic measurement of multiple primary electric currents. In this embodiment, the current transformers (each labeled CT) are separate from the inventive apparatus.

FIG. 10 illustrates a functional embodiment of the present invention. Many components are the same as previously shown, and these components function in the manner previously described. Apparatus 7 comprises a current-sensing resistor R1, a voltage control and selection circuit 9, a power supply circuit 2, and a control circuit 3. Control circuit 3 and voltage control and selection circuit 9 function to select and control multiple current transformers CT for periodic measurement of multiple primary electric currents J1.

Each electric power system conductor 10 has an insulating covering 11. Each electric power system conductor 10 functions as a primary winding of a current transformer CT, with only one turn, with a primary electric current J1 flowing in each conductor 10. Though shown with one end disconnected, each power system conductor 10 is normally connected as part of an electric power system.

For clarity, each current transformer CT comprises a magnetic core 12 and a secondary winding 13 magnetically coupled to magnetic core 12; a primary (or "first") electric current J1 flows in each conductor 10 which is configured as a primary winding of current transformer CT; a secondary electric current J2 flows in each secondary winding 13; each secondary electric current J2 is generally proportionally smaller than each primary electric current J1 by a turns ratio of each current transformer CT. (Generally speaking, if a current transformer secondary current is known, then the primary current is calculable as the secondary current multiplied by the turns ratio of a current transformer).

In the embodiment shown in FIG. 10, the current transformers (each labeled CT) are separate from the inventive apparatus. Terminals 41 and 42 are shown to facilitate connection of each current transformer CT to voltage control and selection circuit 9. These terminals are connecting means for connecting each current transformer CT to voltage control and selection circuit 9. The terminals may be embodied as terminal blocks with screw-type connections, terminal blocks with spring-type connections, soldered connections, pressure connections, bolted connections, wire-nut connections, ring-terminal connections, or other prior-art connecting means.

With this configuration, it is possible to utilize multiple ordinary current transformers to measure d-c currents and a-c currents having d-c current component. Improved accuracy in the measurement of a-c currents is also possible.

Although three current transformers CT are shown, the invention may utilize any number of current transformers. Additional current transformers may be accommodated by simply adding additional terminals 41 and 42 and an additional electronic switch 31 (and suitable control connection) for each additional current transformer (with similar interconnections as shown for each of three current transformers CT).

Voltage control and selection circuit 9 functionally has a current transformer selection circuit 8 and a voltage control circuit 1. The current transformer selection circuit has multiple electronic switches 31. Each electronic switch 31 is individually controlled by control circuit 3 as indicated by the dashed lines between each electronic switch 31 and control circuit 3. Electronic switches 31 are each single-pole double-throw switches, and each switch functions to provide either a short-circuit path (or a "bypass path") for a current transformer secondary current J2, or a path for secondary current through voltage control circuit 1 and current-sensing resistor R1. Each electronic switch 31 is shown in its normal "bypass" state, providing a short-circuit path for each current transformer secondary current J2, bypassing voltage control circuit 1 and current-sensing resistor R1.

Control circuit 3 periodically switches each electronic switch 31, one at a time, to periodically route each secondary current J2 through voltage control circuit 1 and current-sensing resistor R1. Resistor R1 is a current-sensing means which provides an information signal (voltage V3) to control circuit 3. The information signal is received by control circuit 3 via conductors 4 and 5. The information signal contains information about secondary currents J2, from which information about primary currents J1 may be determined. (Voltage V3 is proportional to the secondary current flowing through resistor R1).

The secondary current J2 of the selected current transformer CT flows through a loop circuit as follows: secondary current J2 flows from the selected current transformer secondary winding 13 through corresponding terminal 42, through current-sensing resistor R1, through voltage control circuit 1, through the selected electronic switch 31, through corresponding terminal 41 back to the opposite side of the selected current transformer secondary winding 13. Since the secondary current J2 of the selected current transformer CT flows through current-sensing resistor R1 regardless of the output voltage V1 of voltage control circuit 1, control circuit 3 can measure the secondary current of the selected current transformer regardless of the output voltage V1 of voltage control circuit 1. Magnetic control of the selected current transformer CT is implemented by control circuit 3 controlling output voltage V1 as described for FIGS. 8A to 8E, and/or FIGS. 9A to 9E, and/or as disclosed by the 517 patent and the 157 patent. Demagnetizing the current transformer magnetic core and reducing the effective burden of the current transformer secondary circuit are primary ways that current measurement accuracy may be improved.

Control circuit 3 controls voltage control circuit 1 so that its adjustable output voltage V1 controls the magnetic flux in the magnetic core of the selected current transformer for improved current measurement functionality, in accordance with the 517 patent and the 157 patent. By controlling output voltage V1, voltage V2 across each secondary winding 13 is controlled so as to control the magnetic flux in each current transformer.

Control circuit 3 periodically selects each current transformer one at a time (by controlling electronic switches 31), thereby periodically routing each secondary electric current J2 through the current-sensing means (resistor R1) and voltage control circuit 1. Control circuit 3 implements magnetic control for each current transformer one at a time (by controlling voltage V1, thereby controlling voltage V2), receives and processes the information signal (voltage V3), thereby periodically determining information about each primary electric current J1.

Power supply circuit 2 provides operating power to voltage control circuit 1. Power supply circuit 2 may simply comprise connecting means (such as a terminal block, an input jack, or a cord and plug) to connect to an external power source; or it may comprise any prior-art power supply means for providing suitable operating power. Control circuit 3 also normally requires a supply of operating power (not shown), which may be supplied by prior-art power supplies as required for the particular application.

Control circuit 3 processes the information signal (voltage V3), and typically communicates information about the measured currents to other equipment via multiple conductors 16. Such other equipment may include a visual display, a wireless communication interface, a wired communication interface, a fiber-optic communication interface, a power calculating means for calculating electric power, an energy calculating means for calculating electric energy consumption, a data acquisition system, a digital control system, a protective relaying system, an overcurrent protection system, a power monitoring system, and an archival system for storing historical data.

Control circuit 3 may be part of a larger electricity monitor or electric power meter, which also measures voltage, in which case control circuit 3 may utilize information about the measured currents to calculate electric power parameters or electric energy parameters.

In summary, FIG. 10 shows apparatus (7) for measuring a plurality of primary electric currents (each labeled J1) in a non-contact manner by utilizing a plurality of current transformers (each labeled CT); each of the current transformers (CT) being coupled with one of the primary electric currents (J1); each of the current transformers (CT) comprising a magnetic core (each labeled 12) and a secondary winding (each labeled 13); each secondary winding (13) conducting a secondary electric current (each labeled J2); the apparatus (7) comprising:

(a) a current-sensing means (resistor R1) for periodically receiving each secondary electric current (J2) and for providing a first information signal (voltage V3) containing information about each secondary electric current (J2);

(b) a voltage control and selection circuit (9) for periodically connecting each secondary winding (13) to the current-sensing means (resistor R1) and for periodically controlling a voltage (V2) across each secondary winding (13);

(c) a power supply circuit (2) for providing operating power to the voltage control and selection circuit (9);

(d) and a control circuit (3) for receiving the first information signal (voltage V3) and for controlling the voltage control and selection circuit (9);

the control circuit (3) and the voltage control and selection circuit (9) functioning to select and control the plurality of current transformers (CT) for periodic measurement of the plurality of primary electric currents (J1).

Stated more completely, FIG. 10 shows apparatus (7) for measuring a plurality of primary electric currents (each labeled J1) in a non-contact manner by utilizing a plurality of current transformers (each labeled CT); each current transformer CT of the plurality of current transformers comprising one of a plurality of magnetic cores (each labeled 12) and one of a plurality of secondary windings (each labeled 13), and having one of the plurality of primary electric currents (J1) flowing in one of a plurality of primary conductors (each labeled 10); each of the plurality of primary conductors (10) configured as a primary winding; each of the plurality of secondary windings (13) conducting one of a plurality of secondary electric currents (each labeled J2); the apparatus comprising:

(a) a current-sensing means (resistor R1) for periodically receiving each of the plurality of secondary electric currents (J2) and for providing an information signal (voltage V3) containing information about the plurality of secondary electric currents (J2);

(b) a voltage control and selection circuit (9) for periodically connecting each of the plurality of secondary windings (13) to the current-sensing means (resistor R1) and for periodically controlling a second voltage (V2) across each of the plurality of secondary windings (13); the voltage control and selection circuit (9) for connection to each of the plurality of secondary windings (13); the voltage control and selection circuit (9) connected to the current sensing means (resistor R1);

(c) a power supply circuit (2) for providing operating power to the voltage control and selection circuit (9); the power supply circuit (2) being connected to the voltage control and selection circuit (9);

(d) and a control circuit (3) for receiving and processing the information signal (voltage V3) and for controlling the voltage control and selection circuit (9); the control circuit (3) being connected to the current-sensing means (resistor R1) and the voltage control and selection circuit (9);

the control circuit (3) and the voltage control and selection circuit (9) functioning to select and control the plurality of current transformers (CT) for periodic measurement of the plurality of primary electric currents (J1); the control circuit (3) and the voltage control and selection circuit (9) further functioning to periodically route each of the plurality of secondary electric currents (J2) through the current-sensing means (resistor R1); thereby providing for periodic measurement of each of the plurality of primary electric currents (J1).

Further, each of the plurality of magnetic cores (12) comprises saturable magnetic material, and each of the plurality of magnetic cores conducts one of a plurality of magnetic fluxes; each of the plurality of secondary electric currents having an error associated with one of the plurality of magnetic fluxes. The control circuit controls the second voltage so as to periodically control each of the plurality of magnetic fluxes in such a way that the error is reduced, thereby causing each of the plurality of secondary electric currents to periodically be more accurately proportional to each of the plurality of primary currents than would be the case without the apparatus.

Further, the control circuit and the voltage control and selection circuit further controls the second voltage in such a way that fluxuations of the plurality of magnetic fluxes are reduced, thereby causing each of the plurality of secondary electric currents to periodically be more accurately proportional to each of the plurality of primary electric currents; and wherein the primary electric currents are selected from the group consisting of a-c current, d-c current, and a-c current having a d-c component.

Further, the control circuit and the voltage control and selection circuit further periodically control the second voltage in such a way that the plurality of magnetic cores are periodically demagnetized, thereby causing each of the plurality of secondary electric currents to periodically be more accurately proportional to each of the plurality of primary electric currents; and wherein the primary electric currents are selected from the group consisting of a-c current, d-c current, and a-c current having a d-c component.

Further, the control circuit and the voltage control and selection circuit further periodically control the second voltage in such a way that fluxuations of the plurality of magnetic fluxes are reduced, thereby causing each of the plurality of secondary electric currents to periodically be more accurately proportional to each of the plurality of primary electric currents.

Further, the voltage control and selection circuit (9) comprises a voltage control circuit (1) and a current transformer selection circuit (8); the voltage control circuit (1) providing a first voltage (V1) at a first output; the voltage control circuit (1) being connected between the power supply circuit (2) and the current transformer selection circuit (8); the voltage control circuit (1) being controlled by the control circuit (3); the current transformer selection circuit (8) comprising a first plurality of electronic switches (31); the current transformer selection circuit (8) being connected to the first output and having connecting means (terminals 41 and 42) for connecting to the plurality of secondary windings (13); the current transformer selection circuit (8) functioning to connect the plurality of secondary windings (13) one-at-a-time to the first output; the current transformer selection circuit (8) being controlled by the control circuit (3).

Figure 11:
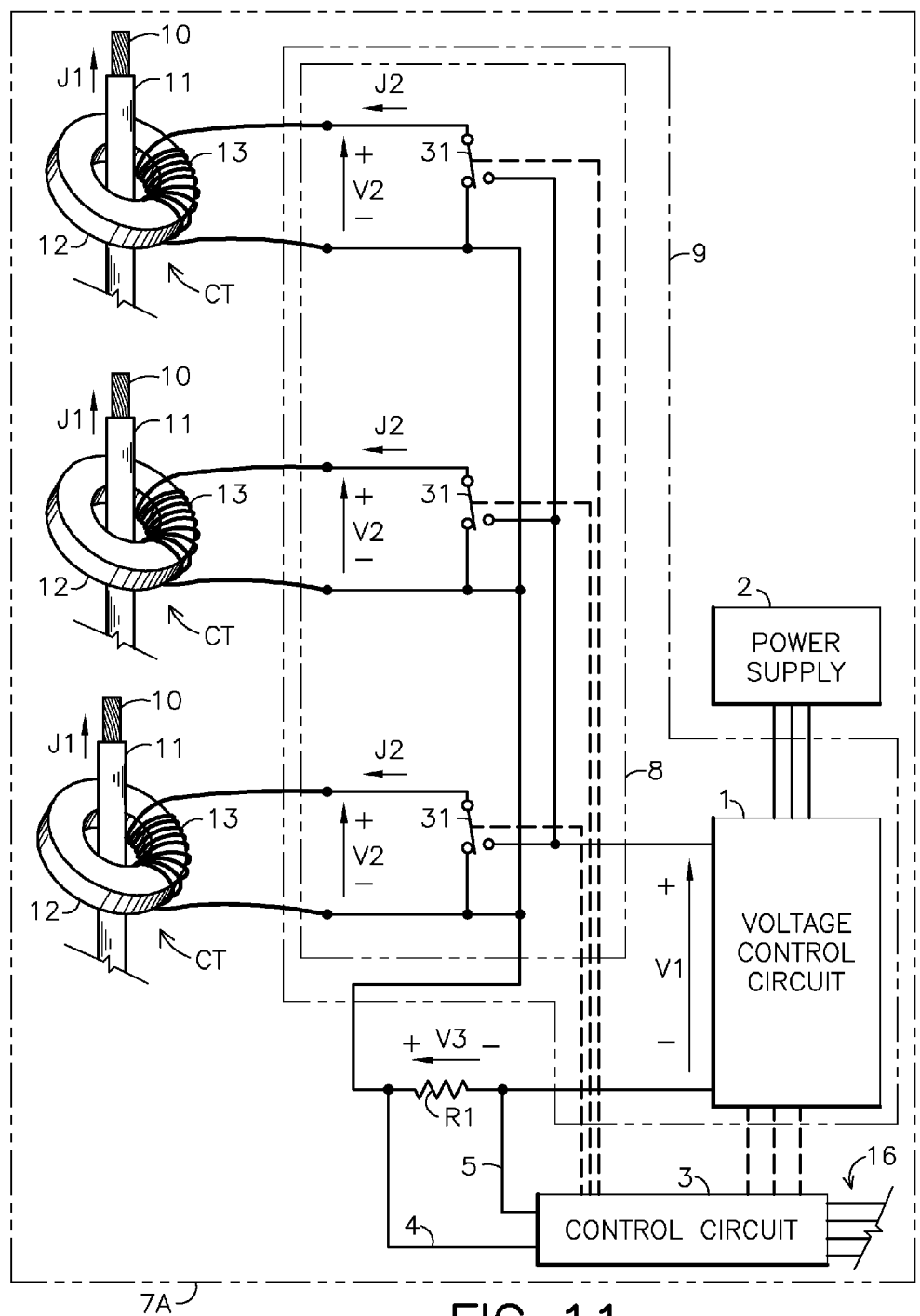
FIG. 11 is similar to FIG. 10, except that in this alternate embodiment the current transformers (each labeled CT) are an integral part of apparatus 7A.

FIG. 11 is similar to FIG. 10, except that in this alternate embodiment the current transformers (each labeled CT) are an integral part of apparatus 7A. Apparatus 7A comprises a current-sensing resistor R1, a voltage control and selection circuit 9, a power supply circuit 2, and control circuit 3, and multiple current transformers CT. Many components are the same as previously shown, and these components function in the manner previously described.

Although three current transformers CT are shown, the invention may utilize any number of current transformers. Additional current transformers may be accommodated by simply adding an additional electronic switch 31 (with suitable control connection) for each additional current transformer (with similar interconnections as shown for each of three current transformers CT).

Figure 12:
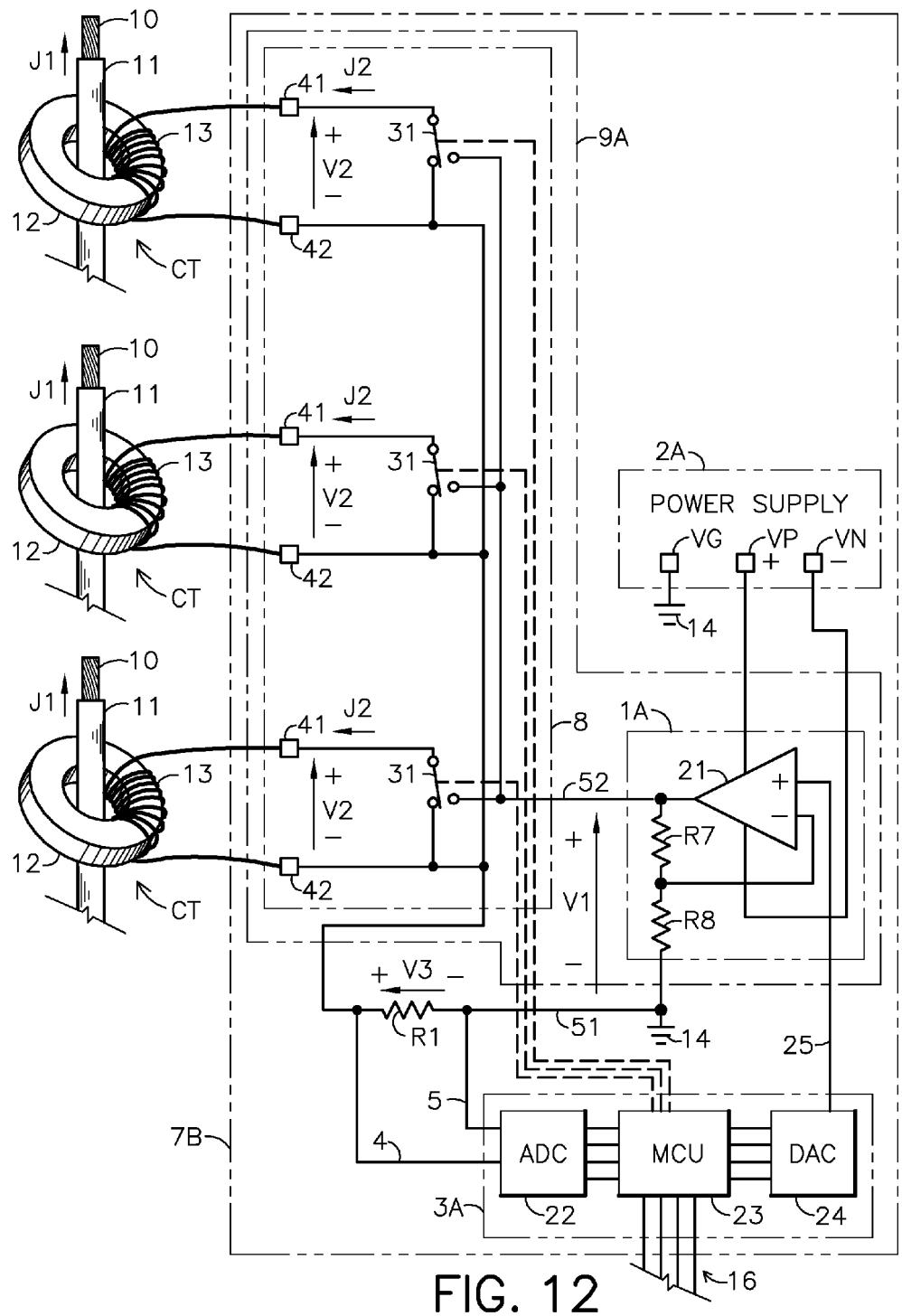
FIG. 12 is a development of FIG. 10. A voltage control circuit 1A is embodied as an amplifier circuit capable of producing continuously adjustable output voltage (voltage V1). A control circuit 3A is now embodied as an analog-to-digital converter circuit 22, a microcontroller circuit 23, and a digital-to-analog circuit 24. Power supply circuit 2A provides a positive and negative d-c voltage output as operating power for the amplifier circuit.

FIG. 12 is a development of FIG. 10. Apparatus 7B comprises a current-sensing resistor R1, a voltage control and selection circuit 9A, a power supply circuit 2A, and a control circuit 3A. Many components are the same as previously shown, and these components function in the manner previously described.

Voltage control and selection circuit 9A functionally has a current transformer selection circuit 8 and a voltage control circuit 1A. Voltage control circuit 1A is embodied as an amplifier circuit capable of producing a continuously adjustable output voltage (voltage V1) on an output conductor 52 relative to a common conductor 51. Control circuit 3A is now embodied as an analog-to-digital converter circuit 22, a microcontroller circuit 23, and a digital-to-analog circuit 24. Power supply circuit 2A provides a positive and negative d-c voltage output as operating power for the amplifier circuit. With this configuration, voltage control circuit 1A provides a continuously adjustable bipolar voltage output (output voltage V1) for magnetic control.

Control circuit 3A has an analog-to-digital converter circuit 22 to sense secondary current J2 (as voltage V3 across resistor R1), a microcontroller 23 for data processing and control functions, and a digital-to-analog converter circuit 24. Digital-to-analog converter circuit 24 provides an analog voltage signal on conductor 25 that controls the voltage output of voltage control circuit 1A. Analog-to-digital converter circuit 22 and microcontroller 23 communicate via an interface shown as four conductors, and this interface may vary considerably depending on the particular design. Likewise microcontroller 23 communicates with digital-to-analog converter circuit 24 via an interface that may vary considerably depending on the particular design. Alternately, the analog-to-digital converter and digital-to-analog converter may be an integral part of the microcontroller.

Voltage control and selection circuit 9A functionally has a current transformer selection circuit 8 and a voltage control circuit 1A. Current transformer selection circuit 8 is the same as in FIGS. 10 and 11. Voltage control circuit 1A has an operational amplifier 21, with resistors R7 and R8 configured to set the gain of operational amplifier 21. Power supply circuit 2A provides operating power to operational amplifier 21. A positive d-c voltage is provided at terminal VP, a negative d-c voltage is provided at terminal VN, both relative to a common voltage terminal VG.

Control circuit 3A also requires a power supply circuit, which is not shown. These power supply circuits are well-established in the prior art.

Ground connection 14 to common conductor 51 provides a common reference potential for the various circuits and power supply.

Operational amplifier 21 must be able to produce voltage in a circuit with relatively large current driven by a current source (a current transformer acts like a current source). A "power operational amplifier" will usually be required, as discussed in the 517 patent.

The secondary current J2 of the selected current transformer CT flows through a loop circuit as follows: secondary current J2 flows from the selected current transformer secondary winding 13 through corresponding terminal 42, through current-sensing resistor R1, through common conductor 51, through power supply 2A (via ground connection 14 and terminal VG), through operational amplifier 21, through output conductor 52, through the selected electronic switch 31, through corresponding terminal 41 back to the opposite side of the selected current transformer secondary winding 13. Since the secondary current J2 of the selected current transformer CT flows through current-sensing resistor R1 regardless of the output voltage V1 of voltage control circuit 1A, control circuit 3A can measure the secondary current of the selected current transformer regardless of the output voltage V1 of voltage control circuit 1A. Magnetic control of the selected current transformer CT is implemented by control circuit 3A controlling output voltage V1 as described for FIGS. 8A to 8E, and/or disclosed by the 517 patent and the 157 patent. Demagnetizing the current transformer magnetic core and reducing the effective burden of the current transformer secondary circuit are primary ways that current measurement accuracy may be improved.

The type of control configuration shown in FIG. 12 (utilizing an analog-to-digital converter circuit to sense an input signal, a microcontroller to implement a control function based on the input signal, a digital-to-analog converter to produce an analog control signal, and an operational amplifier to produce a voltage proportional to the analog control signal) is well established in the prior art, so additional configuration details will not be described herein. Microcontroller 23 is programmed to sequentially select each current transformer (by controlling electronic switches 31) so that each primary current J1 is measured periodically. Microcontroller 23 is configured to implement the control sequences illustrated and discussed in the 517 patent (for each current transformer, one at a time), to optimize the measurement of each primary current J1.

Figure 13:
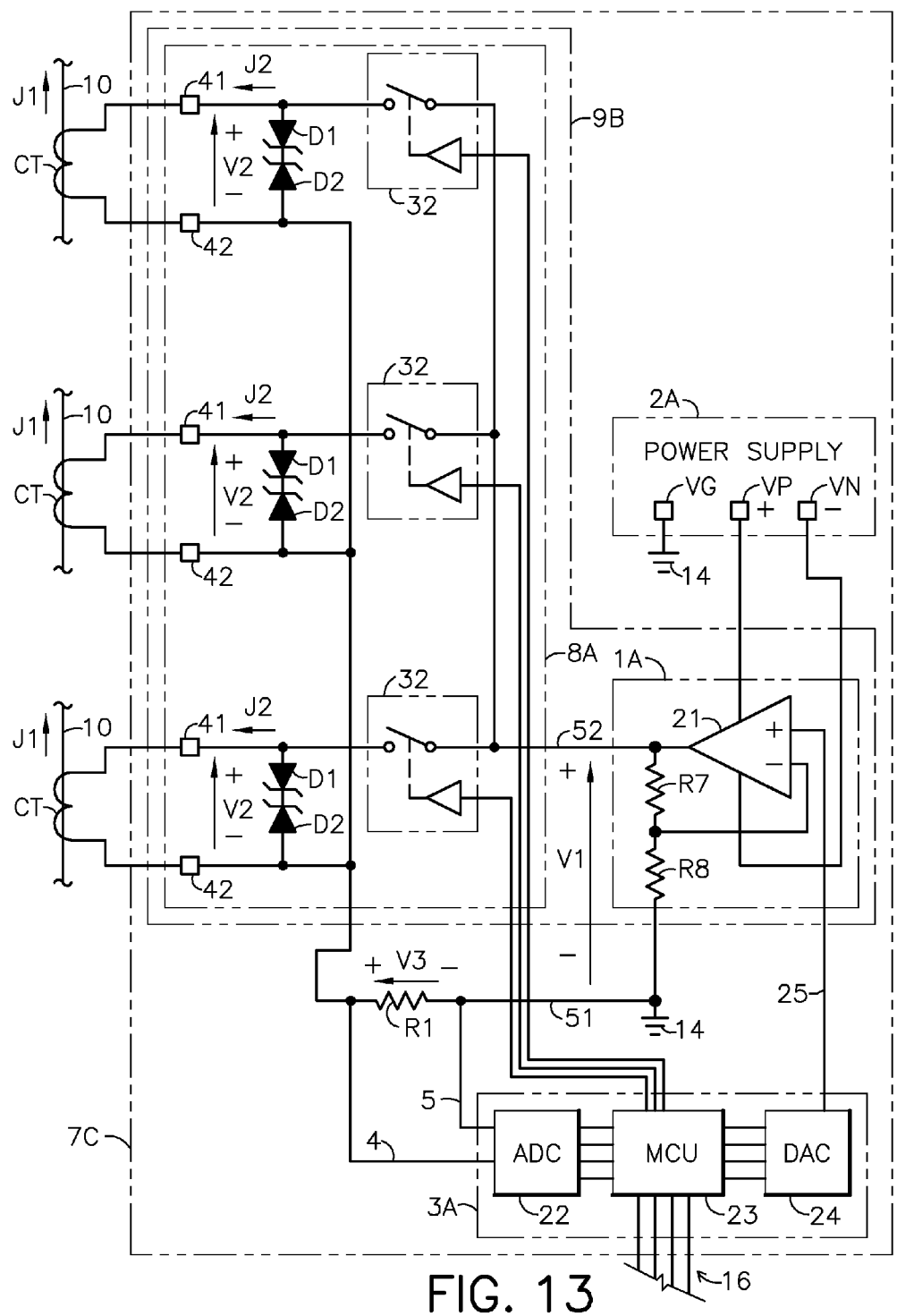
FIG. 13 is a further development of FIG. 12, clarifying one possible embodiment of a current transformer selection circuit 8A.

FIG. 13 is a further development of FIG. 12, clarifying one possible embodiment of a current transformer selection circuit 8A. Apparatus 7C comprises a current-sensing resistor R1, a voltage control and selection circuit 9B, a power supply circuit 2A, and a control circuit 3A. Many components are the same as previously shown, and these components function in the manner previously described. Current transformers CT are now shown as symbolically, due to space constraints.

Voltage control and selection circuit 9B functionally has a current transformer selection circuit 8A and a voltage control circuit 1A.

The main current transformer selection function is now accomplished with analog switches 32. These may be implemented with prior-art integrated circuits, such as Vishay model DG417, or may be implemented with discrete components according to prior art. Prior-art integrated circuits require operating power (not shown) in accordance with their data sheets. The relatively high on-resistance of most prior-art analog switches makes the embodiment shown in FIG. 13 not presently preferred. Cost-effective analog switches typically have on-resistances which limit the magnitude of secondary currents J2, and contribute significantly to secondary circuit burden.

One of the current transformers (each labeled CT) is selected for current measurement by control circuit 3 closing one of analog switches 32. Secondary current J2 of the selected current transformer is thereby routed through voltage control circuit 1A and current-sensing resistor R1. For current transformers not selected, zener diodes D1 and D2 provide a bypass path for secondary currents J2.

For proper operation, analog switches 32 must be operated within their functional voltage limits, and voltage V1 must be less than the reverse-breakdown voltages of zener diodes D1 and D2. From a practical perspective, this results in a requirement that the reverse-breakdown voltages of zener diodes D1 and D2 be less than the functional voltage rating of analog switches 32, and voltage V1 must be kept less than the reverse-breakdown voltages of zener diodes D1 and D2.

Stated another way: Voltage control circuit (1A) comprises an amplifier circuit, and the current transformer selection circuit (9B) comprises a plurality of analog switches (32) and a plurality of voltage clamping devices (zener diodes D1 and D2); the plurality of analog switches (32) being connected between the output of the voltage control circuit (1A) and the plurality of secondary windings (13) and functioning to connect the first voltage (V1) to the plurality of secondary windings (13); the plurality of voltage clamping devices (zener diodes D1 and D2) being connected across the plurality of secondary windings (13) and functioning to provide a plurality of current paths for the plurality of secondary currents (J2) whenever the corresponding plurality of analog switches (32) are in an off state.

Figure 14:
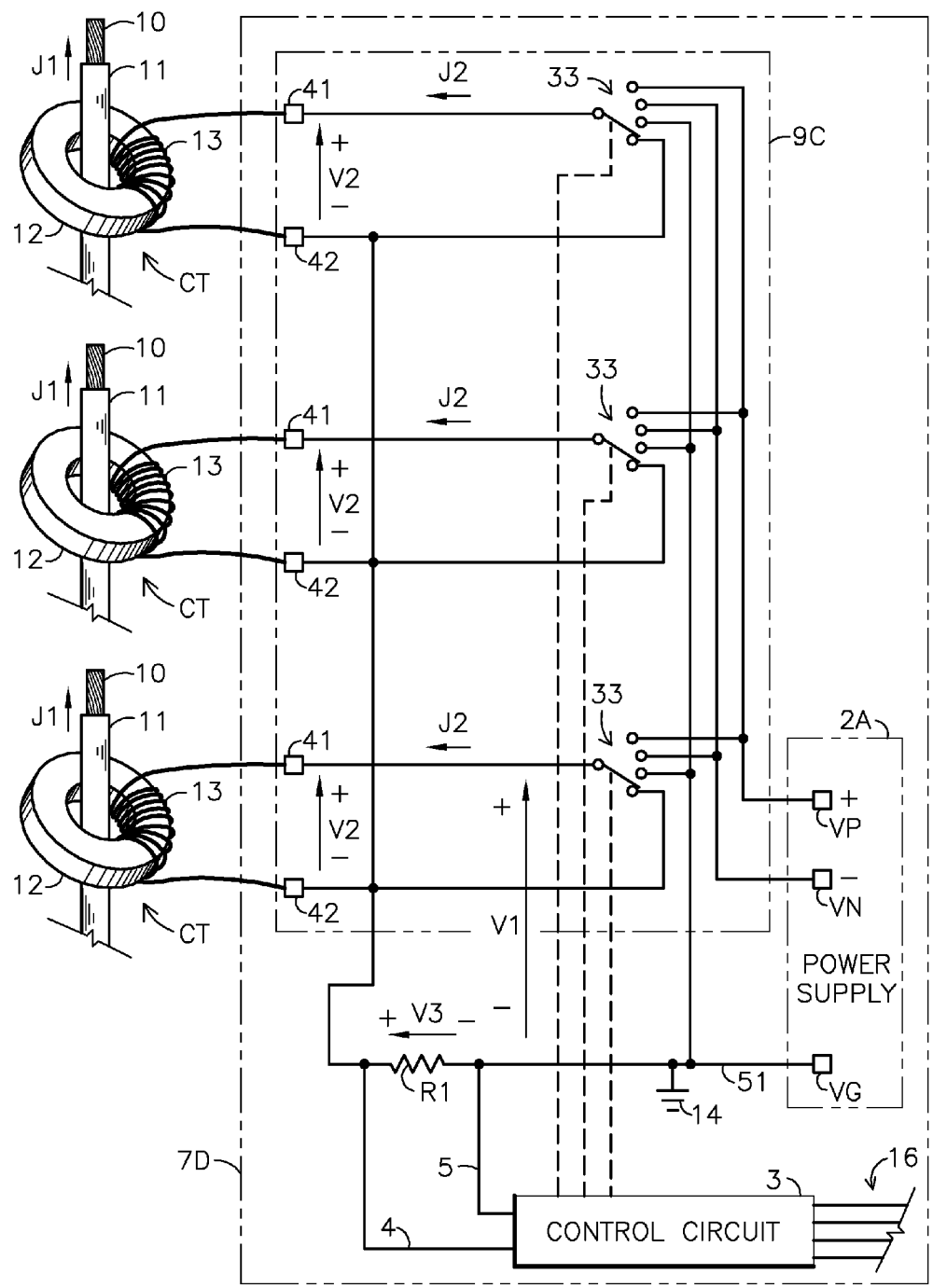
FIG. 14 illustrates an alternate functional embodiment of the present invention. In this embodiment, a voltage control and selection circuit 9C is comprised of electronic switches that are not functionally separable into a separate current transformer selection circuit and a separate voltage control circuit. This embodiment utilizes a switched-voltage type of magnetic control.

FIG. 14 illustrates an alternate functional embodiment of the present invention. Apparatus 7D comprises a current-sensing resistor R1, a voltage control and selection circuit 9C, a power supply circuit 2A, and a control circuit 3. This embodiment utilizes a switched-voltage type of magnetic control. In this embodiment, voltage control and selection circuit 9C is comprised of electronic switches that are not functionally separable into a separate current transformer selection circuit and a separate voltage control circuit. Many components are the same as previously shown, and these components function in the manner previously described.

Each electronic switch 33 is functionally single-pole four-throw. Each switch is shown in bypass mode, simply providing a closed circuit for each secondary current J2. To select and control a current transformer, control circuit 3 switches one of the electronic switches between its three other states: connection of a positive voltage to a secondary winding 13; connection of a negative voltage to a secondary winding 13; or connection of a secondary winding 13 to common conductor 51 (bypassing power supply circuit 2A). In each of these cases the secondary current J2 of the selected current transformer CT flows through a loop circuit as follows: secondary current J2 flows from the selected current transformer secondary winding 13 through corresponding terminal 42, through current-sensing resistor R1, through common conductor 51, (optionally through power supply 2A, depending on the state of the selected electronic switch 33), through the selected electronic switch 33, through corresponding terminal 41 back to the opposite side of the selected current transformer secondary winding 13. Since secondary current J2 flows through current-sensing resistor R1 regardless of the state of the selected electronic switch 33, control circuit 3 can measure the secondary current of the selected current transformer in any of the three switch states. Switched-voltage magnetic control of the selected current transformer CT is implemented as described for FIGS. 9A to 9E and as further disclosed by the 517 patent and the 157 patent.

Stated another way, the voltage control and selection circuit (9C) comprises a plurality of electronic switches (33); the plurality of electronic switches (33) are configured in such a way as to function to both connect the plurality of secondary windings (13) one-at-a-time to the current-sensing means (resistor R1) and to cause the second voltage (V2) across each of the plurality of secondary windings (13) to be a switched bipolar voltage.

Figure 15:
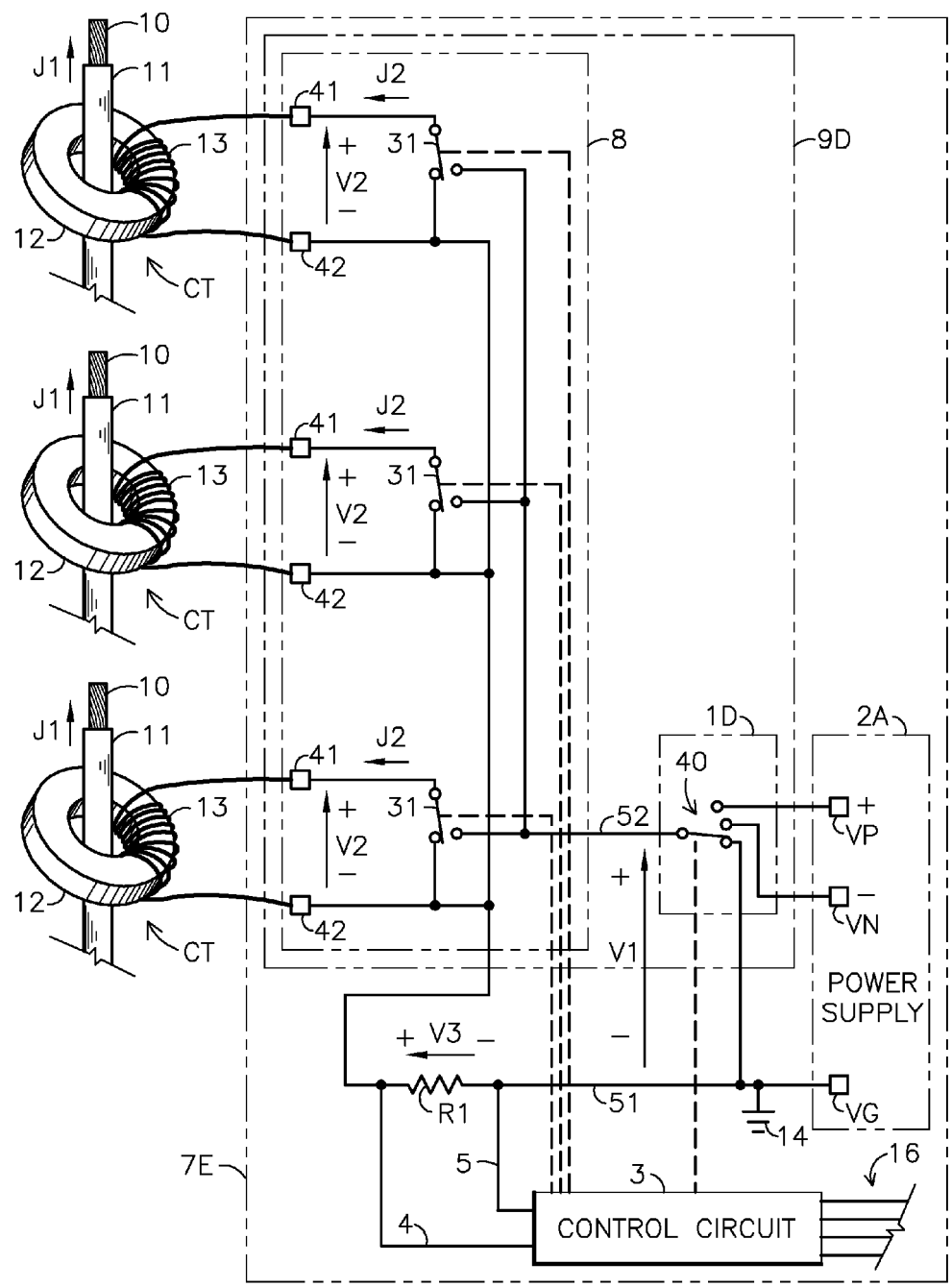
FIG. 15 is another embodiment that utilizes a switched-voltage type of magnetic control. In this embodiment, a voltage control and selection circuit 9D is comprised of electronic switches that are functionally separable into a current transformer selection circuit 8 and voltage control circuit 1D.

FIG. 15 is another embodiment that utilizes a switched-voltage type of magnetic control. Apparatus 7E comprises a current-sensing resistor R1, a voltage control and selection circuit 9D, a power supply circuit 2A, and a control circuit 3.

In this embodiment, a voltage control and selection circuit 9D is comprised of electronic switches that are functionally separable into a current transformer selection circuit 8 and voltage control circuit 1D. Many components are the same as previously shown, and these components function in the manner previously described.

Each electronic switch 31 functions to either select the current transformer connected to it for control and current measurement, or provide a bypass path for secondary current J2, as previously described for FIG. 10.

Electronic switch 40 provides for switched-voltage control of the selected current transformer. Electronic switch 40 is functionally single-pole triple-throw (this may be realized with three single-pole single-throw electronic switches connected and controlled for the same functionality). To control a current transformer, control circuit 3 switches electronic switch 40 between its three states: connection of a positive voltage to output conductor 52 (and the selected secondary winding 13); connection of a negative voltage to output conductor 52 (and the selected secondary winding 13); or connection of output conductor 52 (and the selected secondary winding 13) directly to common conductor 51 (bypassing the power supply). In each of these cases the secondary current J2 of the selected current transformer CT flows through a loop circuit as follows: secondary current J2 flows from the selected current transformer secondary winding 13 through corresponding terminal 42, through current-sensing resistor R1, through common conductor 51, (optionally through power supply circuit 2A, depending on the state of electronic switch 40), through electronic switch 40, through output conductor 52, through the selected electronic switch 31, through corresponding terminal 41 back to the opposite side of the selected current transformer secondary winding 13. Since secondary current J2 flows through current-sensing resistor R1 regardless of the state of electronic switch 40, control circuit 3 can measure the secondary current of the selected current transformer in any of the three switch states. Switched-voltage magnetic control of the selected current transformer CT is implemented as described for FIGS. 9A to 9E and as further clarified by the 517 patent and the 157 patent.

Stated another way: the voltage control circuit (1D) comprises one or more electronic switches (40), and the power supply circuit (2A) provides one or more d-c voltage outputs to the voltage control circuit (1D); the control circuit (3) controlling the one or more electronic switches (40) in such a way that the first voltage (V1) is a bipolar switched voltage.

Figure 16:
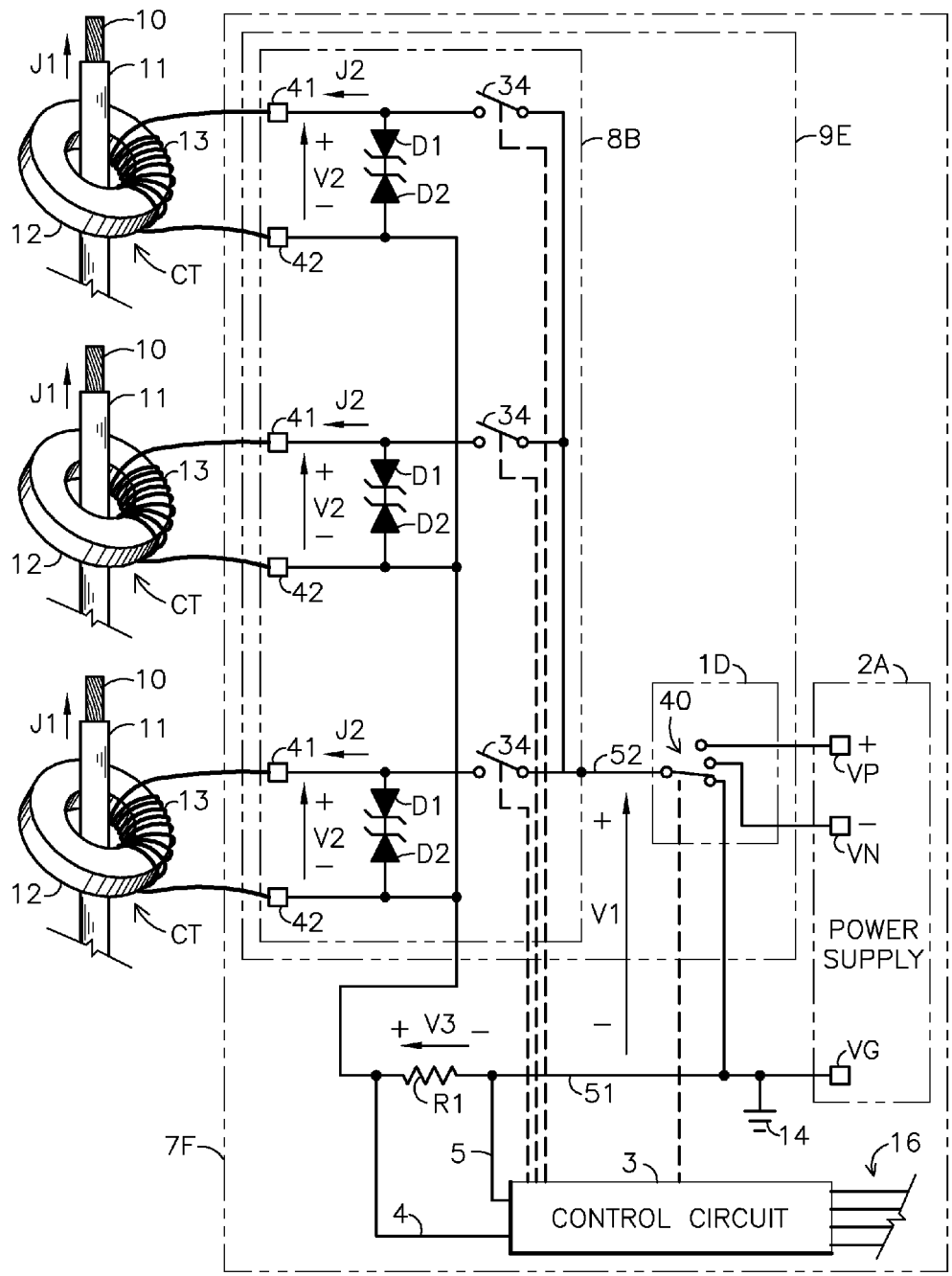
FIG. 16 is a development of FIG. 15, showing simpler electronic switches for current transformer selection circuit 8B.

FIG. 16 is a development of FIG. 15, showing simpler electronic switches for current transformer selection circuit 8B. Apparatus 7F comprises a current-sensing resistor R1, a voltage control and selection circuit 9E, a power supply circuit 2A, and a control circuit 3. Many components are the same as previously shown, and these components function in the manner previously described.

Voltage control and selection circuit 9E functionally has a current transformer selection circuit 8B and a voltage control circuit 1D.

Each electronic switch 34 is simply single-pole single-throw. Only one electronic switch 34 is closed at once (as controlled by control circuit 3). When a switch 34 is closed, the respective current transformer is selected for control and current measurement. When a switch 34 is open zener diodes D1 and D2 provide a bypass path for secondary current J2.

Operation of voltage control circuit 1D is the same as described for FIG. 15.

Figure 17:
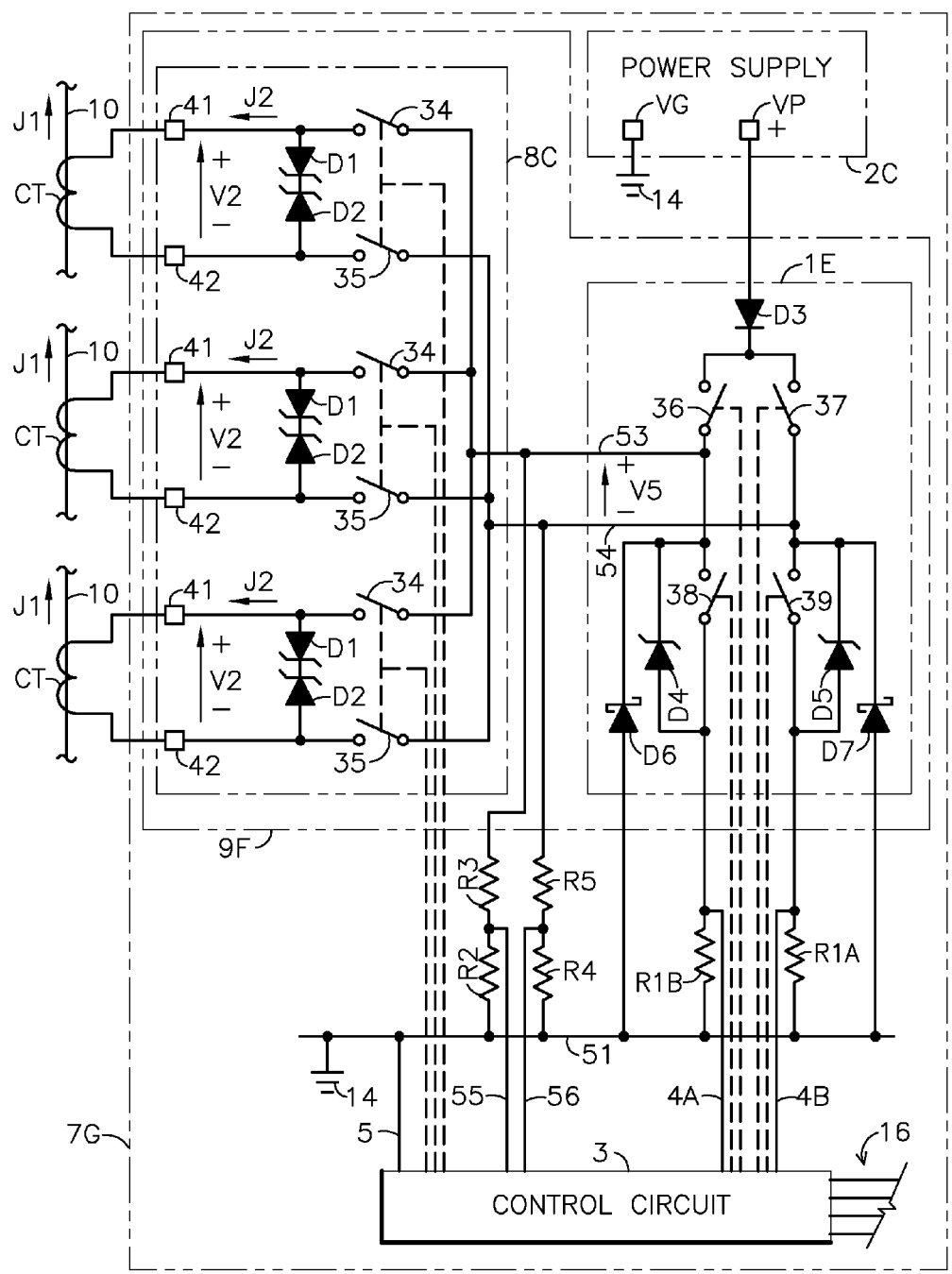
FIG. 17 illustrates how the invention may be realized by using an H-bridge circuit as part of a voltage control circuit 1E, with a power supply circuit 2C having only one d-c voltage output.

FIG. 17 illustrates how the invention may be realized by using an H-bridge circuit as part of a voltage control circuit 1E, with a power supply circuit 2C having only one d-c voltage output. Apparatus 7G comprises current-sensing resistors R1A and R1B, a voltage control and selection circuit 9F, a power supply circuit 2C, a control circuit 3, and voltage-divider resistors R2, R3, R4, and R5. Many components are the same as previously shown, and these components function in the manner previously described.

Voltage control and selection circuit 9F functionally has a current transformer selection circuit 8C and a voltage control circuit 1E.

Current transformer selection circuit 8C is similar to current transformer selection circuit 8B in FIG. 16, except that now two single-pole single-throw electronic switches 34 and 35 are used to select each current transformer CT. Both switches operate at the same time, as controlled by control circuit 3.

Voltage control circuit 1E now is configured as an H-bridge switching circuit, with two high-side electronic switches 36 and 37, and two low-side electronic switches 38 and 39. The H-bridge switching circuit basically operates to provide bipolar voltage pulses at its output (voltage V5, across output conductors 53 and 54), or to just provide a current path through current-sensing resistors R1A or R1B. These three preferred switching states for the H-bridge are clarified as follows:
 (a) A positive-polarity voltage pulse, resulting from closing switches 36 and 39 (while switches 37 and 38 are open).
 (b) A negative-polarity voltage pulse, resulting from closing switches 37 and 38 (while switches 36 and 39 are open).
 (c) No voltage pulse, resulting from closing switches 38 and 39 (while switches 36 and 37 open).
with this H-bridge configuration two current-sensing resistors are used to measure secondary currents J2: resistor R1A and resistor R1B. Positive-polarity secondary currents produce a positive voltage across resistor R1A, and negative-polarity secondary currents produce a positive voltage across resistor R1B (both voltages are relative to the reference potential on common conductor 51). Conductors 4A and 4B conduct these information signals to control circuit 3. Secondary current of the selected current transformer is measurable in this way during any of the three different H-bridge switching states described above. With this configuration, control circuit 3 needs to measure only positive voltages.

Since current transformers operate in a manner that is similar to current sources, the polarity of secondary current is somewhat independent of the polarity of the applied voltage pulses. For this reason, provision must be made for secondary currents flowing in the opposite direction than voltage pulse polarity would imply. Diode D3 prevents these reverse currents from flowing into power supply circuit 2C. Zener diodes D4 and D5 provide a path for these reverse currents which still allows for the measurement of these reverse currents by current-sensing resistors R1A and R1B. The reverse-breakdown voltage of zener diodes D4 and D5 should be somewhat greater than the output voltage of power supply circuit 2C.

Schottky diodes D6 and D7 provide current paths for negative currents around electronic switches 38 and 39 and current-sensing resistors R1A and R1B. These diodes prevent the voltages at the middle of the H-bridge from going negative by more than a few tenths of a volt. This helps protect sensitive input circuitry in control circuit 3 from negative voltages.

For optimal magnetic control of the selected current transformer, it is preferable to measure output voltage V5 of voltage control circuit 1E. The output voltage of output conductor 53 relative to common conductor 51 is measured by using a voltage divider circuit comprising resistor R2 and resistor R3. The resulting voltage signal is conducted to control circuit 3 by conductor 55. The output voltage of output conductor 54 relative to common conductor 51 is measured by using a voltage divider circuit comprising resistor R4 and resistor R5. The resulting voltage signal is conducted to control circuit 3 by conductor 56. Conductor 5 conducts the reference voltage level to control circuit 3.

Stated another way:

The voltage control circuit (1E) comprises four electronic switches (36, 37, 38, 39) connected as an H-bridge, and the power supply circuit (2C) provides a unipolar voltage to a high side of the H-bridge. The H-bridge functions to cause the switched voltage (V5) at its output to be a bipolar switched voltage. The current transformer selection circuit (8C) comprises dual electronic switches (34 and 35) connected between each of the plurality of secondary windings (13) and the output of the voltage control circuit (1E); each set of the dual electronic switches (34 and 35) operating together to connect each of the plurality of secondary windings (13) one-at-a-time to the output of the voltage control circuit (1E).

The current-sensing means comprises a first current-sensing resistor (R1A) and a second current-sensing resistor (R1B), each connected between a lower side of the H-bridge and a common conductor; and the information signal comprises a first analog voltage signal across the first current-sensing resistor (R1A) and a second analog voltage signal across the second current sensing resistor (R1B).

The current transformer selection circuit (8C) further comprises a plurality of voltage clamping devices (zener diodes D1 and D2) for connection in parallel with the plurality of secondary windings (13); the plurality of voltage clamping devices (zener diodes D1 and D2) providing current paths for the plurality of secondary currents (J2) when each of the plurality of current transformers (CT) is not selected. The voltage control circuit (1E) further comprises a diode (D3) connected between the H-bridge and the power supply circuit (2C) to prevent current flow from the H-bridge into the power supply circuit (2C). The voltage control circuit (1E) further comprises two zener diodes (D4 and D5), each connected from a high side of one of the current-sensing resistors (R1A and R1B) to a midpoint of the H-bridge for providing current paths for reverse currents. The voltage control circuit (1E) further comprises two diodes (D6 and D7), each connected from the common conductor to a middle side of the H-bridge, for providing current paths for negative currents while limiting the magnitude of negative voltage on the H-bridge. The apparatus further comprises one or more voltage-sensing means for measuring one or more voltages at the output of the voltage control circuit (1E); the one or more voltage-sensing means comprising one or more voltage-divider circuits (resistors R2, R3, R4, R5); each voltage divider circuit connected between the output of the voltage control circuit (1E) and the common conductor, with a midpoint of each voltage-divider circuit connected to the control circuit (3); the one or more voltage-divider circuits functioning to scale the one or more voltages for measurement by the control circuit (3); the control circuit (3) further utilizing measured magnitudes of the one or more voltages to optimize control of the plurality of current transformers.

Figure 18:
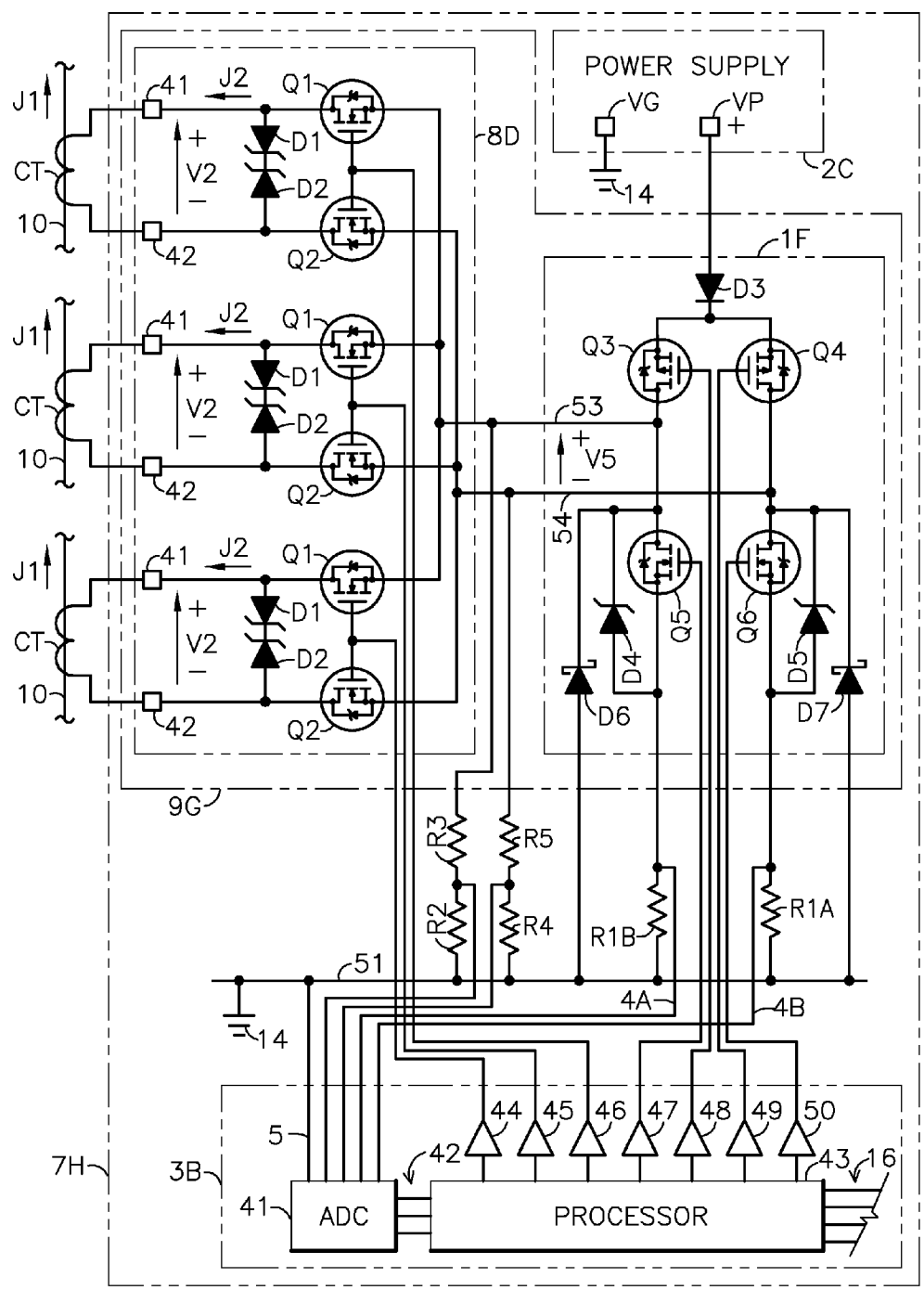
FIG. 18 is a more-detailed development of FIG. 17, showing how MOSFET transistors may be used to realize the electronic switches shown in FIG. 17, and also showing additional control circuit components.

FIG. 18 is a more-detailed development of FIG. 17, showing how MOSFET transistors may be used to realize the electronic switches shown in FIG. 17, and also showing additional control circuit components (MOSFET is an acronym for Metal-Oxide Semiconductor Field-Effect Transistor). Apparatus 7H comprises current-sensing resistors R1A and R1B, a voltage control and selection circuit 9G, a power supply circuit 2C, a control circuit 3B, and voltage-divider resistors R2, R3, R4, and R5. Many components are the same as previously shown, and these components function in the manner previously described.

Voltage control and selection circuit 9G functionally has a current transformer selection circuit 8D and a voltage control circuit 1F.

Control circuit 3B comprises an analog-to-digital converter circuit 41, a processor circuit 43, and MOSFET driver circuits 44, 45, 46, 47, 48, 49, and 50. Analog-to-digital converter circuit 41 has two inputs to measure H-bridge output voltages and two inputs to measure voltages across current-sensing resistors R1A and R1B, in addition to a reference voltage input from common conductor 51. Analog-to-digital converter circuit 41 receives the analog signals and converts them into digital signals, and communicates the digital signals to processor circuit 43 via multiple conductors 42. Processor circuit 43 has multiple ON/OFF outputs to control MOSFET driver circuits 44, 45, 46, 47, 48, 49, and 50, which in turn control the MOSFET transistors.

The MOSFET transistors correlate one-to-one with the electronic switches shown in FIG. 17. MOSFET transistors Q1 and Q2 (one set for each current transformer) correlate with electronic switches 34 and 35. MOSFET transistors Q3, Q4, Q5, and Q6 correlate with electronic switches 36, 37, 38 and 39 respectively.

Stated another way: The control circuit comprises a processing means (43) for implementing digital control and an analog-to-digital converter means (41) for converting the information signal into a digital signal; the analog-to-digital converter means (41) receiving the information signal and providing a corresponding digital signal to the processing means (43); the processing means receiving the digital signal and controlling the voltage control circuit (1F) and the current transformer selection circuit (8D).

The first plurality of electronic switches are comprised of a first plurality of MOSFET transistors (Q1 and Q2), the one or more electronic switches are comprised of a second plurality of MOSFET transistors (Q3, Q4, Q5, Q6), and the control circuit (3B) further comprises a plurality of MOSFET driver circuits (44, 45, 46, 47, 48, 49, 50) for driving the first plurality of MOSFET transistors (Q1 and Q2) and the second pluralilty of MOSFET transistors (Q3, Q4, Q5, Q6); the plurality of MOSFET driver circuits (44, 45, 46, 47, 48, 49, 50) being connected between the processing means (43) and the first plurality of MOSFET transistors (Q1 and Q2) and between the processing means (43) and the second plurality of MOSFET transistors (Q3, Q4, Q5, Q6). The plurality of voltage clamp devices (D1 and D2) are selected from the group consisting of back-to-back zener diodes and metal-oxide varistors. Furthermore, the analog-to-digital converter circuit (41) and the processing means (43) may be part of a single microcontroller circuit.

FIG. 18 shows the preferred embodiment of the invention. Some key parameters of the preferred embodiment are:
  (a) Current transformers CT: Approx. 1000:1 ratio, solid magnetic core, secondary winding resistance less than 50 ohms, primary current rating of about 30 amperes.
  (b) MOSFET transistors Q1 and Q2: N-channel enhancement-mode; sensitive gates (maximum 3.0V gate threshold voltage); Gate-Source voltage rating +/−20V; maximum 0.5 ohm on-resistance.
  (c) MOSFET transistors Q3 and Q4: P-channel enhancement-mode; sensitive gates (maximum 3.0V gate threshold voltage); Gate-Source voltage rating +/−20V; maximum 0.5 ohm on-resistance.
  (d) MOSFET transistors Q5 and Q6: N-channel enhancement-mode; sensitive gates (maximum 3.0V gate threshold voltage); Gate-Source voltage rating +/−20V; maximum 0.5 ohm on-resistance.
  (e) Power supply circuit 2C: Output voltage: 10V
  (f) Zener diodes D1 and D2: Reverse-breakdown voltage: Approx. 16.5V
  (g) Zener diodes D4 and D5: Reverse-breakdown voltage: Approx. 12.8V
  (h) Current-sensing resistors R1A and R1B: 24.9 ohms
  (i) Voltage divider resistors R3 and R5: 102 k ohms
  (j) Voltage divider resistors R2 and R4: 11.3 k ohms
  (k) MOSFET Drivers 44, 45, and 46: Microchip model TC4427; use 17V drive voltage from a separate power supply (not shown).
  (l) MOSFET Drivers 47, 48, 49, and 50: Microchip model TC4427; use 10V drive voltage from power supply circuit 2C.
  (m) Analog-to-digital converter circuit 41 and processor 43: A standard microcontroller with an integral multichannel analog-to-digital converter, an integral voltage reference (approx. 2.25V), and communication ports; such as Silicon Labs model C8051F501.

While the preferred embodiment of the invention utilizes MOSFET transistors, it should be understood that any type of transistors or other electronic switches may be utilized to embody the invention.

Finally, for purposes of clarifying the claims, the word "apparatus" has its usual meaning: a set of material or equipment designed for a particular use.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. Apparatus for measuring a plurality of primary electric currents in a non-contact manner by utilizing a plurality of current transformers; each of said current transformers being coupled with one of said primary electric currents; each of said current transformers comprising a magnetic core and a secondary winding; each of said secondary windings conducting one of a plurality of secondary electric currents; said apparatus comprising:
   a. a current-sensing means for periodically receiving each of said secondary electric currents and for providing a first information signal containing information about each of said secondary electric currents;
   b. a voltage control circuit for periodically controlling a voltage across each of said secondary windings;
   c. a current transformer selection circuit for periodically connecting each of said secondary windings to said current-sensing means and said voltage control circuit;
   d. a power supply circuit for providing operating power to said voltage control circuit;
   e. and a control circuit for receiving said first information signal and for controlling said voltage control circuit and said current transformer selection circuit;
   said control circuit being connected to said current-sensing means, said voltage control circuit, and said current transformer selection circuit;
   said voltage control circuit providing a first voltage at a first output; said voltage control circuit being connected to said power supply and said current transformer selection circuit;
   said voltage control circuit being controlled by said control circuit;
   said current transformer selection circuit comprising a first plurality of electronic switches; said current transformer selection circuit being connected to said first output and having connecting means for connecting to each of said secondary windings; said current transformer selection circuit being controlled by said control circuit; said current transformer selection circuit functioning to periodically connect each of said secondary windings one-at-a-time to said first output and to periodically route each of said secondary electric currents one-at-a-time through said current sensing means;
   said apparatus thereby providing for selection and control of each of said current transformers and thereby providing for periodic measurement of each of said primary electric currents.

2. The apparatus of claim 1 wherein said current transformers are an integral part of said apparatus;
   and wherein each of said primary electric currents is selected from the group consisting of a-c current, d-c current, and a-c current having a d-c component.

3. The apparatus of claim 1 wherein said current transformers are separate from said apparatus;
   and wherein said primary electric currents are selected from the group consisting of a-c current, d-c current, and a-c current having a d-c component.

4. The apparatus of claim 1 wherein said apparatus is utilized as part of an electric power meter.

5. The apparatus of claim 1 wherein said control circuit further functions to provide a second information signal for communication to other equipment; said second information signal containing information about said plurality of primary electric currents; said other equipment being selected from the group consisting of a visual display, a wireless communication interface, a wired communication interface, a fiber-optic communication interface, a power calculating means for calculating electric power, an energy calculating means for calculating electric energy consumption, a data acquisition system, a digital control system, a protective relaying system, an overcurrent protection system, a power monitoring system, and an archival system for storing historical data.

6. The apparatus of claim 1 wherein each of said magnetic cores comprises saturable magnetic material, and each of said magnetic cores conducts one of a plurality of magnetic fluxes;
   each of said secondary electric currents having an error associated with one of said magnetic fluxes;
   wherein said control circuit controls said first voltage so as to periodically control each of said magnetic fluxes in such a way that said error is reduced, thereby causing each of said secondary electric currents to periodically be more accurately proportional to each of said primary electric currents than would be the case without said apparatus.

7. The apparatus of claim 6 wherein each of said primary electric currents is selected from the group consisting of a-c current, d-c current, and a-c current having a d-c component.

8. The apparatus of claim 7 wherein said control circuit and said voltage control circuit further control said first voltage in such a way that fluxuations of said magnetic fluxes are periodically reduced, thereby causing each of said secondary electric currents to periodically be more accurately proportional to each of said primary electric currents.

9. The apparatus of claim 7 wherein said control circuit and said voltage control circuit further periodically control said first voltage in such a way that said magnetic cores are periodically demagnetized, thereby causing each of said secondary electric currents to periodically be more accurately proportional to each of said primary electric currents.

10. The apparatus of claim 9 wherein said control circuit and said voltage control circuit further periodically control said first voltage in such a way that fluxuations of said magnetic fluxes are periodically reduced, thereby causing each of said secondary electric currents to periodically be more accurately proportional to each of said primary electric currents.

11. The apparatus of claim 1 wherein said first voltage is a continuously adjustable bipolar voltage.

12. The apparatus of claim 11 wherein said voltage control circuit comprises an amplifier circuit, and wherein said first plurality of electronic switches comprise a plurality of analog switches, said plurality of analog switches being connected between said first output and said secondary windings and functioning to connect said first voltage to said secondary windings; said current transformer selection circuit further comprising a plurality of voltage clamping devices; said plurality of voltage clamping devices being connected across said secondary windings and functioning to provide a plurality of current paths for said secondary electric currents whenever corresponding said analog switches are in an off state.

13. The apparatus of claim 1 wherein said voltage control circuit comprises one or more electronic switches, and said power supply circuit provides one or more d-c voltage outputs to said voltage control circuit;
    said control circuit controlling said one or more electronic switches in such a way that said first voltage is a bipolar switched voltage.

14. The apparatus of claim 13 wherein said one or more electronic switches comprises four electronic switches connected as an H-bridge, and wherein said power supply circuit provides a unipolar voltage to a high side of said H-bridge; said H-bridge functioning to cause said first voltage at said first output to be said bipolar switched voltage.

15. The apparatus of claim 14 wherein said first plurality of electronic switches comprises a plurality of dual electronic switches connected between each of said secondary windings and said first output; each set of said dual electronic switches operating together and being controlled by said control circuit to connect each of said secondary windings one-at-a-time to said first output.

16. The apparatus of claim 15 wherein said current-sensing means comprises a first current-sensing resistor and a second current-sensing resistor, each connected between a lower side of said H-bridge and a common conductor; and wherein said first information signal comprises a first analog voltage signal across said first current-sensing resistor and a second analog voltage signal across said second current sensing resistor.

17. The apparatus of claim 16 wherein said apparatus further comprises one or more voltage-sensing means for measuring said first voltage at said first output; said one or more voltage-sensing means comprising one or more voltage-divider circuits; each of said voltage divider circuits connected between said first output and said common conductor, with a midpoint of each voltage-divider circuit connected to said control circuit; said one or more voltage-divider circuits functioning to scale one or more voltages associated with said first output for measurement by said control circuit;
    said control circuit further utilizing a measured magnitude of said first voltage to optimize control of said current transformers.

18. The apparatus of claim 17 wherein said current transformer selection circuit further comprises a plurality of voltage clamping devices for connection in parallel with said plurality of secondary windings; said plurality of voltage clamping devices providing current paths for said secondary electric currents when corresponding said current transformers are not selected;
    wherein said voltage control circuit further comprises a first diode connected between said H-bridge and said power supply circuit to prevent current flow from said H-bridge into said power supply circuit;
    wherein said voltage control circuit further comprises two zener diodes, each connected from a high side of one of said current-sensing resistors to a midpoint of said H-bridge for providing current paths for reverse currents;
    and wherein said voltage control circuit further comprises a second diode and a third diode, each connected from said common conductor to a midpoint of said H-bridge, for providing current paths for negative currents and for limiting the magnitude of negative voltage on said H-bridge.

19. The apparatus of claim 18 wherein said control circuit comprises a processing means for implementing digital control and an analog-to-digital converter means for converting said first information signal into a digital signal;
    said analog-to-digital converter means receiving said first information signal and providing a corresponding digital signal to said processing means;
    said processing means receiving said corresponding digital signal and controlling said voltage control circuit and said current transformer selection circuit.

20. The apparatus of claim 19 wherein said first plurality of electronic switches are comprised of a first plurality of MOSFET transistors, said one or more electronic switches are comprised of a second plurality of MOSFET transistors, and said control circuit further comprises a plurality of MOSFET driver circuits for driving said first plurality of MOSFET transistors and said second plurality of MOSFET transistors; said plurality of MOSFET driver circuits being connected between said processing means and said first plurality of MOSFET transistors and between said processing means and said second plurality of MOSFET transistors;
    wherein said plurality of voltage clamping devices are selected from the group consisting of back-to-back zener diodes and metal-oxide varistors;
    and wherein said analog-to-digital converter circuit and said processing means are both part of a single microcontroller circuit.

* * * * *